(12) United States Patent
Lee et al.

(10) Patent No.: US 12,324,195 B2
(45) Date of Patent: Jun. 3, 2025

(54) MULTI-CHANNEL FIELD EFFECT TRANSISTORS WITH ENHANCED MULTI-LAYERED SOURCE/DRAIN REGIONS

(71) Applicant: Samsung Electronics Co., Ltd., Suwon-si (KR)

(72) Inventors: Sanggil Lee, Ansan-si (KR); Jungtaek Kim, Yongin-si (KR); Dohyun Go, Suwon-si (KR); Pankwi Park, Incheon (KR); Dongsuk Shin, Suwon-si (KR); Namkyu Cho, Yongin-si (KR); Ryong Ha, Seoul (KR); Yang Xu, Seoul (KR)

(73) Assignee: Samsung Electronics Co., Ltd. (KR)

( * ) Notice: Subject to any disclaimer, the term of this patent is extended or adjusted under 35 U.S.C. 154(b) by 500 days.

(21) Appl. No.: 17/866,966

(22) Filed: Jul. 18, 2022

(65) Prior Publication Data

US 2023/0141852 A1 May 11, 2023

(30) Foreign Application Priority Data

Nov. 8, 2021 (KR) .................... 10-2021-0152050

(51) Int. Cl.
*H10D 30/69* (2025.01)
*H10D 62/13* (2025.01)
(Continued)

(52) U.S. Cl.
CPC ......... *H10D 30/797* (2025.01); *H10D 62/151* (2025.01); *H10D 84/017* (2025.01); *H10D 84/038* (2025.01); *H10D 84/856* (2025.01)

(58) Field of Classification Search
None
See application file for complete search history.

(56) References Cited

U.S. PATENT DOCUMENTS 10,937,862 B2 3/2021 Reznicek et al.
11,469,332 B2 * 10/2022 Lee ..................... H10D 62/151
(Continued)

FOREIGN PATENT DOCUMENTS

| KR | 20190111618 A | 10/2019 |
|---|---|---|
| KR | 20200111997 A | 10/2020 |
| KR | 20230045715 A | 4/2023 |

*Primary Examiner* — Cory W Eskridge
(74) *Attorney, Agent, or Firm* — Myers Bigel, P.A.

(57) ABSTRACT

A semiconductor device includes a semiconductor active region having a vertical stack of multiple spaced-apart semiconductor channel regions thereon. A gate electrode extends on the active region and between the spaced-apart channel regions. A source/drain region contacts the spaced-apart channel regions. The source/drain region includes a stack of at least first, second and third epitaxial layers having different electrical characteristics. The first epitaxial layer contacts the active region and each of the spaced-apart channel regions. The second epitaxial layer contacts a first portion of an upper surface of the first epitaxial layer. The third epitaxial layer contacts a second portion of the upper surface of the first epitaxial layer. Each of the first, second and third epitaxial layers includes silicon germanium (SiGe) with unequal levels of germanium (Ge) therein. A level of germanium in the third epitaxial layer exceeds a level of germanium in the second epitaxial layer, which exceeds a level of germanium in the first epitaxial layer.

20 Claims, 23 Drawing Sheets

(51) Int. Cl.
*H10D 84/01* (2025.01)
*H10D 84/03* (2025.01)
*H10D 84/85* (2025.01)

(56) References Cited

U.S. PATENT DOCUMENTS

| | | | |
|---|---|---|---|
| 2019/0067490 A1* | 2/2019 | Yang | H10D 30/6735 |
| 2019/0296144 A1* | 9/2019 | Jung | H10D 30/62 |
| 2020/0044025 A1 | 2/2020 | Liu et al. | |
| 2020/0075724 A1 | 3/2020 | Wang et al. | |
| 2020/0168723 A1 | 5/2020 | Hsu et al. | |
| 2020/0303521 A1* | 9/2020 | Son | H01L 29/42392 |
| 2021/0175345 A1 | 6/2021 | Hung et al. | |
| 2021/0234017 A1 | 7/2021 | Yao et al. | |
| 2022/0102521 A1* | 3/2022 | Dewey | H10D 30/43 |
| 2023/0111579 A1 | 4/2023 | Ha et al. | |

* cited by examiner

MULTI-CHANNEL FIELD EFFECT TRANSISTORS WITH ENHANCED MULTI-LAYERED SOURCE/DRAIN REGIONS

REFERENCE TO PRIORITY APPLICATION

This application claims priority to Korean Patent Application No. 10-2021-0152050, filed Nov. 8, 2021, the disclosure of which is hereby incorporated herein by reference.

FIELD OF THE INVENTION

The present invention relates to integrated circuit devices and, more particularly, to field effect transistors.

BACKGROUND

As demand for high performance, high speed, and/or multifunctionality in a semiconductor devices has increased, the integration density of these semiconductor devices has also increased. When manufacturing a semiconductor device having a fine pattern corresponding to the trend for higher integration density, it may be necessary to implement patterns having a fine width or a fine spacing. Moreover, to overcome the relative limitations in the operational properties of such devices, which are caused by a reduction of a size of a planar metal oxide semiconductor FET (MOSFET), for example, attempts have been made to develop semiconductor devices including a FinFET having a three-dimensional (3D) channel structure.

SUMMARY

Example embodiments of the present invention provide a semiconductor device having improved electrical properties.

According to an example embodiment of the present invention, a semiconductor device is provided, which includes an active region extending in a first direction on a substrate, and a plurality of channel layers spaced apart from each other in a vertical direction perpendicular to an upper surface of the substrate, on the active region. A gate structure is provided on the substrate. This gate structure intersects the active region and the plurality of channel layers, surrounds the plurality of channel layers, and extends in a second direction. A source/drain region is provided, which extends on the active region on at least one side of the gate structure and is in contact with the plurality of channel layers. The source/drain region includes a first epitaxial layer, which extends on the active region and contacts the plurality of channel layers, and has a first upper surface that is configured to be recessed. The source/drain region also includes a second epitaxial layer, which is in contact with a first portion of the first upper surface of the first epitaxial layer, and has a second upper surface configured to be recessed. The source/drain region also includes a third epitaxial layer, which is in contact with a second portion of the first upper surface of the first epitaxial layer and the second upper surface of the second epitaxial layer.

According to another embodiment of the present invention, a semiconductor device includes: (i) an active region extending in a first direction on a substrate, (ii) a plurality of channel layers spaced apart from each other in a vertical direction perpendicular to an upper surface of the substrate, on the active region, (iii) a gate structure intersecting the active region and the plurality of channel layers, surrounding the plurality of channel layers, and extending in a second direction, on the substrate, and (iv) a source/drain region extending on the active region on at least one side of the gate structure and in contact with the plurality of channel layers. According to some of these embodiments, the source/drain region includes: a first epitaxial layer extending on the active region and in contact with the plurality of channel layers, a second epitaxial layer extending on the first epitaxial layer, a third epitaxial layer extending on the second epitaxial layer, and a fourth epitaxial layer extending on the third epitaxial layer. The third epitaxial layer may include a first surface in contact with the fourth epitaxial layer, a second surface in contact with the first epitaxial layer, and a third surface in contact with the second epitaxial layer.

According to another embodiment of the present disclosure, a semiconductor device is provided, which includes an active region extending in a first direction on a substrate, a gate structure intersecting the active region and extending in a second direction, on the substrate, and a source/drain region. The source/drain region extends on the active region and on at least one side of the gate structure. The source/drain region includes a lower epitaxial layer having an upper surface configured to be recessed, and an upper epitaxial layer extending on the lower epitaxial layer and having a lower surface with a curved shape (curved toward the upper surface of the lower epitaxial layer). The source/drain region also includes an intermediate epitaxial layer extending between the lower epitaxial layer and the upper epitaxial layer. Advantageously, an uppermost end of the intermediate epitaxial layer extends on a level lower than a level of an uppermost end of the upper epitaxial layer and an uppermost end of the lower epitaxial layer.

BRIEF DESCRIPTION OF DRAWINGS

The above and other aspects, features, and advantages of the present disclosure will be more clearly understood from the following detailed description, taken in combination with the accompanying drawings, in which.

DETAILED DESCRIPTION

Hereinafter, embodiments of the present disclosure will be described as follows with reference to the accompanying drawings.

Figure 1:
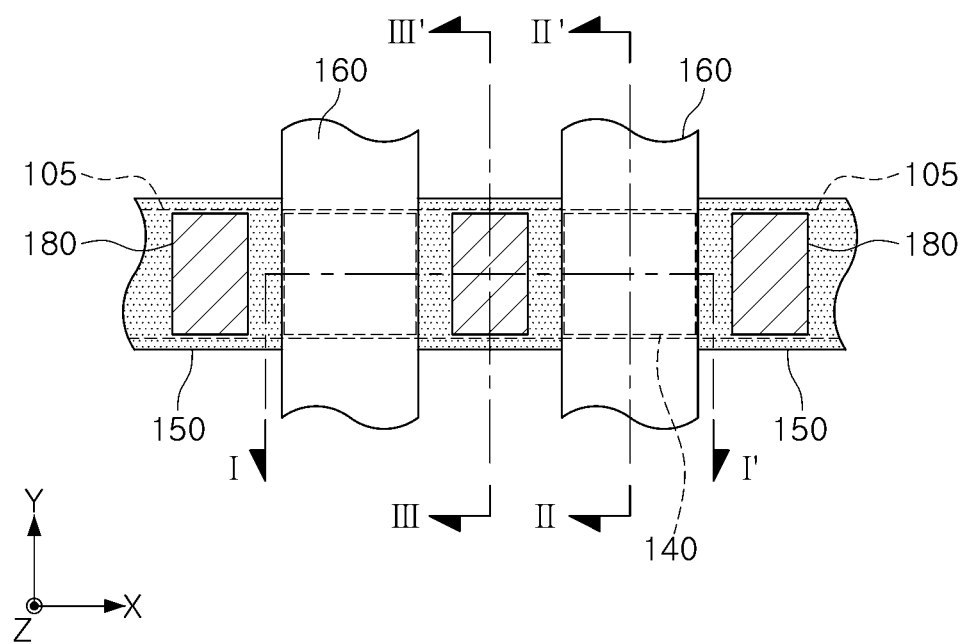
FIG. 1 is a plan diagram illustrating a semiconductor device according to an example embodiment of the present disclosure.
Figure 2:
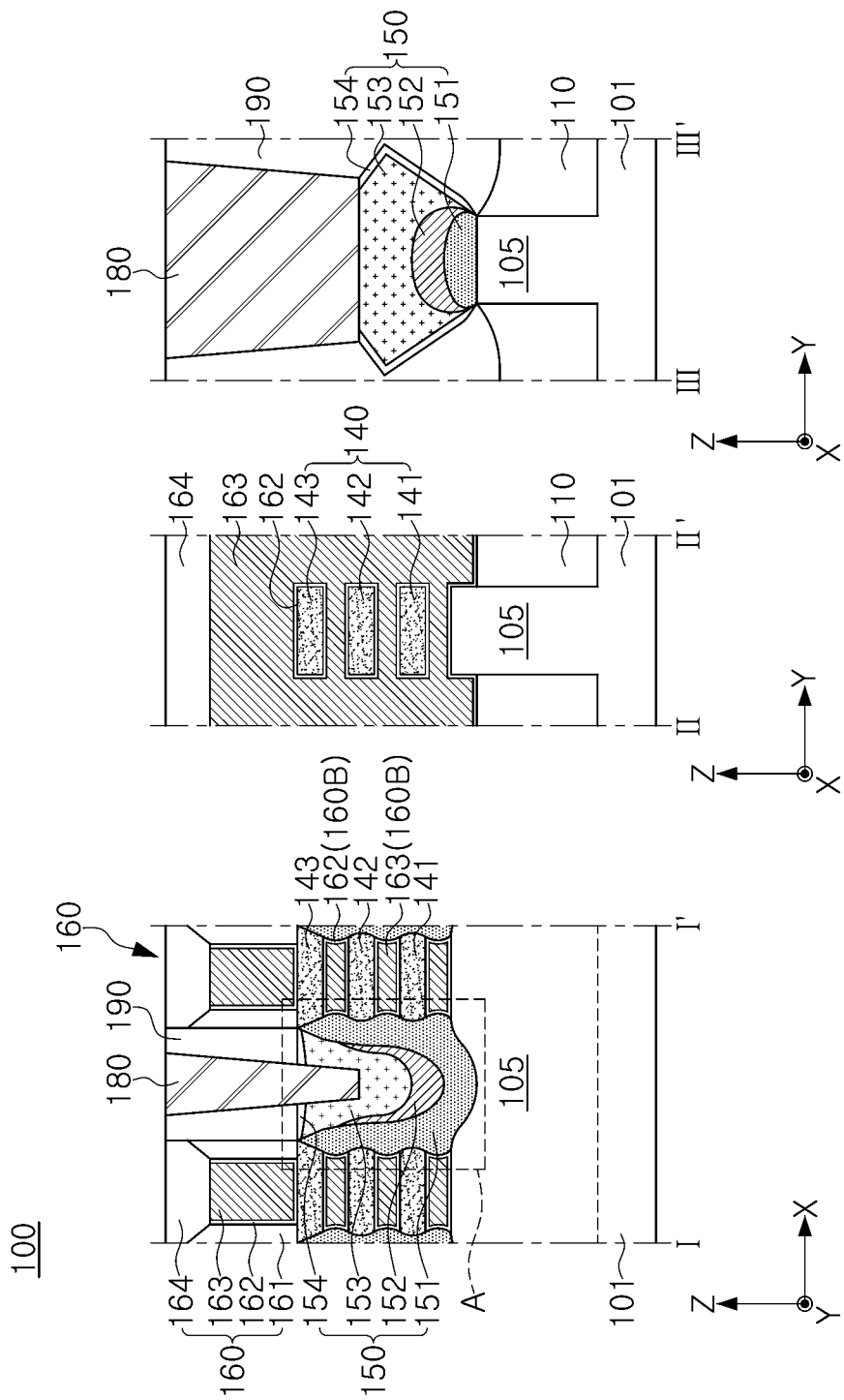
FIG. 2 is a cross-sectional diagram illustrating a semiconductor device according to an example embodiment of the present disclosure.
Figure 3:
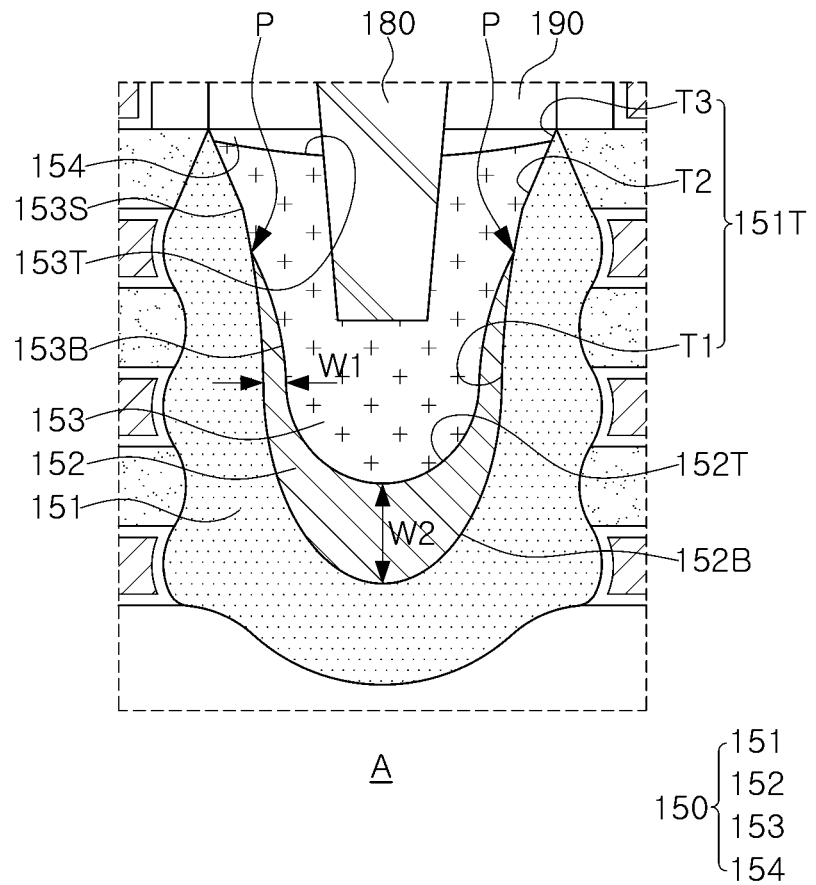
FIG. 3 is an enlarged diagram illustrating a portion of a semiconductor device according to an example embodiment of the present disclosure.

FIG. 1 is a plan diagram illustrating a semiconductor device according to an example embodiment. FIG. 2 is a cross-sectional diagram illustrating a semiconductor device taken along lines I-I', II-II' and III-III' according to an example embodiment. FIG. 3 is an enlarged diagram illustrating a portion of a semiconductor device, illustrating region A in FIG. 2, according to an example embodiment. FIGS. 1 to 3 illustrate only main components of the semiconductor device.

Referring to FIGS. 1 to 3, a semiconductor device 100 may include a substrate 101 (e.g., semiconductor substrate), an active region 105 on the substrate 101, and a channel structure 140 including a plurality of channel layers 141, 142, and 143 vertically spaced apart from each other on the active region 105, a source/drain region 150 in contact with the plurality of channel layers 141, 142, and 143, a gate structure 160 intersecting the active region 105, and a contact plug 180 connected to the source/drain region 150. The semiconductor device 100 may further include device isolation layers 110 and an interlayer insulating layer 190. The gate structure 160 may include a spacer layer 161, a gate dielectric layer 162, a gate electrode layer 163, and a gate capping layer 164.

In the semiconductor device 100, the active region 105 may have a fin structure, and the gate electrode layer 163 may extend: (i) between the active region 105 and the channel structure 140, (ii) between the plurality of channel layers 141, 142, and 143 of the channel structures 140, and (iii) on the channel structure 140, as shown. Accordingly, the semiconductor device 100 may be configured as a gate-all-around type field effect transistor, such as a multi-bridge channel FET (MBCFET™), which is formed by the channel structure 140, the source/drain regions 150, and the gate structure 160. The transistor may operate as a PMOS transistor in some embodiments.

The substrate 101 may have an upper surface extending in the X-direction and in the Y-direction, which is orthogonal to the X-direction. The substrate 101 may include a semiconductor material, such as, for example, a group IV semiconductor, a group III-V compound semiconductor, or a group II-VI compound semiconductor. In some embodiments, a group IV semiconductor may include silicon, germanium, or silicon-germanium. The substrate 101 may also be provided as a bulk wafer (formed from a boule), an epitaxial layer, a silicon-on-insulator (SOI) layer, and a semiconductor-on-insulator (SeOI) layer.

The device isolation layer 110 may define an active region 105 on the substrate 101. The device isolation layer 110 may be formed by, for example, a shallow trench isolation (STI) process. In example embodiments, the device isolation layer 110 may further include a region having a step difference toward a lower portion of the substrate 101 and extending more deeply. The device isolation layer 110 may partially expose an upper portion of the active region 105. In example embodiments, the device isolation layer 110 may have a wavy upper surface having a higher level toward the active region 105. The device isolation layer 110 may be formed of an insulating material. The device isolation layer 110 may be, for example, oxide, nitride, or a combination thereof.

The active region 105 may be defined by the device isolation layer 110 in the substrate 101 and may be disposed to extend in the first direction X. The active region 105 may have a structure protruding from the substrate 101. An upper end of the active region 105 may be disposed to protrude by a predetermined height from the upper surface of the device isolation layer 110. The active region 105 may be formed as a portion of the substrate 101, or may include an epitaxial layer grown from the substrate 101. However, the active region 105 on the substrate 101 may be partially recessed on both sides of the gate structure 160, and the source/drain regions 150 may be disposed on the recessed active region 105. The active region 105 may include impurities or doped regions including impurities.

The channel structure 140 may include first to third channel layers 141, 142, and 143, two or more channel layers spaced apart from each other in a direction perpendicular to the upper surface of the active region 105 (e.g., a Z-direction), on the active region 105. The first to third channel layers 141, 142, and 143 may be connected to the source/drain region 150 and may be spaced apart from the upper surface of the active region 105. The first to third channel layers 141, 142, and 143 may have the same or similar width as that of the active region 105 in the Y-direction, and may have the same or similar width as that of the gate structure 160 in the X-direction. However, in example embodiments, the first to third channel layers 141, 142, and 143 may have a reduced width such that side surfaces may be disposed below the gate structure 160 in the X-direction.

The first to third channel layers 141, 142, and 143 may be formed of a semiconductor material, and may include, for example, silicon (Si). The first to third channel layers 141, 142, and 143 may be formed of, for example, the same material as a material of the substrate 101. The number of the channel layers 141, 142, and 143 included in the channel structure 140 and the shape thereof may be varied in example embodiments. For example, in example embodiments, the channel structure 140 may further include a channel layer disposed on the upper surface of the active region 105.

The source/drain region 150 may be disposed on at least one side of the gate structure 160 on the active region 105. The source/drain regions 150 may be disposed in a recess region recessed from the upper surface of the active region 105. A degree of curvature of the shape of the recess region of the active region 105 may be varied in example embodiments. Accordingly, the shape of the source/drain region 150 formed in the recess region of the active region 105 may also be varied.

In addition, the source/drain region 150 may include a plurality of epitaxial layers, such as first to fourth epitaxial layers 151, 152, 153, and 154. The first epitaxial layer 151 may be disposed on the active region 105 and may extend to be in contact with the plurality of channel layers 141, 142, and 143. The first epitaxial layer 151 may be in contact with a lower portion 160B of the gate structure 160 disposed below each of the channel layers 141, 142, and 143.

The first epitaxial layer 151 may include a protrusion protruding toward the gate structure 160 on the same level as a level of the lower portion 160B of the gate structure 160. In example embodiments, a side surface of the lower portion 160B of the gate structure 160 in the first direction X may be recessed by a predetermined depth and may have an inwardly curved shape. The protrusion of the first epitaxial layer 151 may be disposed in a recess region of the lower portion 160B of the gate structure 160. The width of the first epitaxial layer 151 in the first direction X on the level of the gate structure 160 may be greater than a width of the first epitaxial layer 151 in the first direction X on the level of the first to third channel layers 141, 142, and 143.

A surface of the first epitaxial layer 151 is in contact with the plurality of channel layers 141, 142, and 143, and the lower portion 160B of the gate structure 160 may have a wavy (i.e., uneven) shape, however, other embodiments and shapes are also possible. The shape of the first epitaxial layer 151 may be varied according to the shape of the channel structure 140, and the shape of the gate structure 160. For example, when the semiconductor device further includes an outer spacer (not shown) on an external side of the gate electrode layer 163 of the lower portion 160B, an external side surface of the first epitaxial layer 151 may have a slightly curved shape.

The first epitaxial layer 151 may have an upper surface 151T configured to be recessed. The first epitaxial layer 151 may have an almost U-shape. The upper surface 151T of the first epitaxial layer 151 may include a first portion T1 in contact with the second epitaxial layer 152, a second portion T2 in contact with the third epitaxial layer 153, and a third portion T3 in contact with the fourth epitaxial layer 154.

The first epitaxial layer 151 may include silicon germanium (SiGe) doped with a group 3 element, and may have P-type conductivity. For example, the first epitaxial layer 151 may include one of boron (B), aluminum (Al), gallium (Ga), indium (In), and thallium (Tl) as a doping element. A concentration of germanium (Ge) in the first epitaxial layer 151 may be lower than that of the sacrificial layer 120 (in FIGS. 9A to 9J) before the gate structure 160 is substituted. The first epitaxial layer 151 may have a lower etch selectivity than that of the sacrificial layer 120 under specific etching conditions during a manufacturing process. Due to a difference in etch selectivity as above, the sacrificial layer 120 may be selectively removed in the process in FIG. 9K, and the source/drain region 150 surrounded by the first epitaxial layer 151 may remain. The concentration of Ge of the first epitaxial layer 151 may be, for example, about 5 at % to about 8 at %, where "at %" corresponds to atomic percent.

The second epitaxial layer 152 may be disposed on the first epitaxial layer 151. A lower surface 152B of the second epitaxial layer 152 may be disposed to be in contact with the first portion T1 of the upper surface 151T of the first epitaxial layer 151. The second epitaxial layer 152 may have an upper surface 152T configured to be recessed. The upper surface 152T of the second epitaxial layer 152 may have an almost rounded U-shaped shape, but an example embodiment thereof is not limited to this specific shape. In example embodiments, the upper surface 152T of the second epitaxial layer 152 may have an angular shape.

An uppermost end of the second epitaxial layer 152 may be disposed on a level lower than a level of an uppermost end of the first epitaxial layer 151. In an example embodiment, the uppermost end of the second epitaxial layer 152 may be disposed on a level between a lower surface of the third channel layer 143, which may be an uppermost channel layer, and an upper surface of the second channel layer 142, which may be a second uppermost channel layer adjacent to the uppermost channel layer. The level of the uppermost end of the second epitaxial layer 152 is not limited thereto, and may be varied depending on a reflow condition in a manufacturing process and the concentration of germanium (Ge) of the second epitaxial layer 152.

The first width W1 of the second epitaxial layer 152 in the horizontal direction X may be less than the second width W2 of the second epitaxial layer 152 in the vertical direction Z, in some embodiments. Advantageously, because the first width W1 of the second epitaxial layer 152 has a shape smaller than that of the second width W2, an aspect ratio of the third epitaxial layer 153 may be reduced.

The third epitaxial layer 153 may be disposed on the second epitaxial layer 152 and may fill the source/drain region 150. The lower surface 153B of the third epitaxial layer 153 may be disposed to be in contact with the upper surface 152T of the second epitaxial layer 152. The lower surface 153B of the third epitaxial layer 153 may be disposed on a level higher than a level of the lower surface of the lowermost channel layer 141. The lower surface 153B of the third epitaxial layer 153 may be disposed on a level lower than a level of the lower surface of the uppermost channel layer 143.

The upper surface 153T of the third epitaxial layer 153 may be disposed on a level lower than a level of the upper surface of the uppermost channel layer 143. At least a portion of the upper surface 153T of the third epitaxial layer 153 may be disposed on a level between the upper surface and the lower surface of the uppermost channel layer 143.

The side surface 153S of the third epitaxial layer 153 may be disposed to be in contact with the second portion T2 of the upper surface 151T of the first epitaxial layer 151. The side surface 153B of the third epitaxial layer 153 may be disposed on a level lower than a level of the lower surface of the uppermost channel layer 143.

A point P in which the first to third epitaxial layers 151, 152, and 153 meet may be disposed between a lower surface of the uppermost channel layer 143 and an upper surface of the second uppermost channel layer 142 adjacent to the uppermost channel layer 143 in the vertical direction Z. The uppermost end of the second epitaxial layer 152 may be disposed on a level lower than a level of the uppermost end of the first epitaxial layer 151 and the uppermost end of the third epitaxial layer 153.

As the third epitaxial layer 153 has the shape as described above, the third epitaxial layer 153 may have an aspect ratio smaller than an aspect ratio of the entire source/drain region 150. An aspect ratio of the third epitaxial layer 153 may be about 1.0 to about 1.5.

The lower surface 153B of the third epitaxial layer 153 may have a shape the same as or similar to that of the upper surface 152T of the second epitaxial layer 152 in contact to the lower surface 153B. The lower surface 153B of the third epitaxial layer 153 may have an almost U-shaped rounded shape, but an example embodiment thereof is not limited thereto. In example embodiments, the lower surface 153B of the third epitaxial layer 153 may have a chamfered shape.

The third epitaxial layer 153 may have a width in the first direction X, which may increase in a direction of being away from upper surface of the active region 105. In example embodiments, the width of the third epitaxial layer 153 in the first direction X may gradually increase in the direction of being away from the upper surface of the active region 105.

The fourth epitaxial layer 154 may be disposed on the third epitaxial layer 153. The fourth epitaxial layer 154 is disposed to be in contact with the third portion T3 of the upper surface 151T of the first epitaxial layer 151 and the upper surface 153T of the third epitaxial layer 153. At least a portion of the fourth epitaxial layer 154 may be substantially coplanar with an upper surface of the uppermost channel layer 143.

The first to third epitaxial layers 151, 152, and 153 may include silicon germanium (SiGe) or silicon (Si) doped with a group 3 element. In example embodiments, the first to third epitaxial layers 151, 152, and 153 may have P-type conductivity. For example, the first to third epitaxial layers 151, 152, and 153 may include silicon germanium (SiGe), and may include one of boron (B), aluminum (Al), gallium (Ga), indium (In) and thallium (Tl) as doping elements.

The first to third epitaxial layers 151, 152, and 153 may have germanium (Ge) in different concentrations. A concentration of Ge may increase in the order of the first epitaxial layer 151, the second epitaxial layer 152, and the third epitaxial layer 153. For example, a concentration of Ge of the first epitaxial layer 151 may be about 5 at % to about 8 at %, a concentration of Ge of the second epitaxial layer 152 may be about 40 at % to about 45 at %, and a concentration of Ge of the third epitaxial layer 152 may be about 50 at % and about 55 at %.

The fourth epitaxial layer 154 may include silicon (Si) doped with a group 3 element. The fourth epitaxial layer 154 may include relatively smaller amounts of Ge, if any. The fourth epitaxial layer 154 may be a protective layer capping the first to third epitaxial layers 151, 152, and 153.

The semiconductor device 100 in an example embodiment may include the source/drain region 150 having the above-described structure such that dislocation in the source/drain region 150 may be prevented.

To improve integration density of a semiconductor device, a contacted poly pitch (CPP) between gate structures adjacent to each other may decrease, and an aspect ratio of the source/drain region 150 may increase. However, as the aspect ratio of the source/drain region 150 increases, dislocation in the source/drain region 150 may increase.

One of the causes of dislocations in the source/drain region 150 may be due to crystalline growth properties of silicon-germanium (SiGe). Silicon-germanium (SiGe) included in the first to third epitaxial layers 151, 152, and 153 may have different crystalline growth rates in crystalline directions. For example, silicon-germanium (SiGe) may have a slow growth rate in the [111] direction perpendicular to the (111) plane, which has a relatively low surface energy. That is, the first to third epitaxial layers 151, 152, and 153 may have a slow growth rate in the [111] direction as compared to the horizontal direction (e.g., [110] direction) and the vertical direction (e.g., [100] direction). Accordingly, a dislocation in which an interatomic bond is broken may occur in a boundary between the (110) plane grown along the [110] direction and the (111) plane grown in the [111] direction. As the cavity of the source/drain region 150 in the horizontal direction X decreases due to a decrease in CPP of the semiconductor device, the possibility of the above-described dislocation may increase. In particular, a dislocation may be generated in the third epitaxial layer 153 occupying the largest volume in the source/drain region 150.

A dislocation in the source/drain region 150 may degrade electrical performance of the semiconductor device. In particular, when the semiconductor device 100 is a PMOS, the third epitaxial layer 153 including a high concentration of Ge may work as a stressor applying a compressive force to the channel layers 141, 142, and 143, and charge mobility in the channel layers 141, 142, and 143 may increase. However, when a dislocation is generated in the third epitaxial layer 153, strain relaxation may occur in a region in which an interatomic bond is broken. Accordingly, since the third epitaxial layer 153 may not apply sufficient compressive stress to the channel layers 141, 142, and 143, performance of the semiconductor device may be deteriorated due to the increase in resistance of the channel layers 141, 142, and 143.

Since the source/drain region 150 in an example embodiment has the above-described structural properties, the third epitaxial layer 153 may have a low aspect ratio and dislocation may be prevented. Also, the second epitaxial layer 152 having a second width W2 greater than the first width W1 may be disposed below the third epitaxial layer 153, such that the third epitaxial layer 153 may have a relatively low aspect ratio. Accordingly, defects in the source/drain region 150 may be prevented without limitation in the device CPP, thereby improving performance of the semiconductor device.

The gate structure 160 may intersect the active region 105 and the channel structures 140 on the active region 105 and the channel structures 140 and may extend in one direction, that is, for example, the Y-direction. Channel regions of transistors may be formed in the active region 105 and the channel structures 140 intersecting the gate structure 160. The gate structure 160 may include a gate electrode layer 163, a gate dielectric layer 162 between the gate electrode layer 163 and the plurality of channel layers 141, 142, and 143, and spacer layers 161 on side surfaces of the gate electrode layer 163, and a gate capping layer 164 on the upper surface of the gate electrode layer 163.

The gate dielectric layer 162 may be disposed between the active region 105 and the gate electrode layer 163 and between the channel structure 140 and the gate electrode layer 163, and may be disposed to cover at least a portion of surfaces of the gate electrode layer 163. For example, the gate dielectric layer 162 may be disposed to surround all surfaces other than an uppermost surface of the gate electrode layer 163. The gate dielectric layer 162 may extend to a region between the gate electrode layer 163 and the spacer layers 161, but an example embodiment thereof is not limited thereto. The gate dielectric layer 162 may include oxide, nitride, or a high-k material. The high-k material may refer to a dielectric material having a dielectric constant higher than that of a silicon oxide layer ($SiO_2$). The high dielectric constant material may be, for example, one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The gate electrode layer 163 may be disposed to fill a region between the plurality of channel layers 141, 142, and 143 on the active region 105 and may extend to an upper portion of the channel structure 140. The gate electrode layer 163 may be spaced apart from the plurality of channel layers 141, 142, and 143 by the gate dielectric layer 162. The gate electrode layer 163 may include a conductive material. For example, at least one of a metal nitride (e.g., at least one of a titanium nitride film (TiN), a tantalum nitride film (TaN), and a tungsten nitride film (WN)), a metal material (e.g., aluminum (Al), tungsten (W), and molybdenum (Mo)), and silicon (e.g., doped polysilicon).

The gate electrode layer 163 may include two or more layers. The spacer layers 161 may be disposed on both sides of the gate electrode layer 163. The gate spacer layers 161 may insulate the source/drain region 150 from the gate electrode layer 163. The spacer layers 161 may have a multilayer structure in example embodiments. The spacer layers 161 may include at least one of an oxide, a nitride, an oxynitride, and a low-k dielectric.

The gate capping layer 164 may be disposed on the gate electrode layer 163, and a lower surface thereof may be surrounded by the gate electrode layer 163 and the spacer layers 161. The interlayer insulating layer 190 may be disposed to cover the source/drain region 150, the gate structure 160, and the device isolation layer 110. The interlayer insulating layer 190 may include, for example, at least one of an oxide, a nitride, an oxynitride, and a low-k dielectric.

The contact plug 180 may be connected to the source/drain region 150 through the interlayer insulating layer 190, and may apply an electrical signal to the source/drain region 150. The contact plug 180 may be disposed on the source/drain region 150, and may be disposed to have an elongated length in the Y-direction than the source/drain region 150 in example embodiments. The contact plug 180 may have an inclined side surface in which a lower width may be narrower than an upper width according to an aspect ratio, but an example embodiment thereof is not limited thereto. The contact plug 180 may be disposed to be recessed into the source/drain region 150 by a predetermined depth. In an example embodiment, the contact plug 180 may penetrate the fourth epitaxial layer 154 and may penetrate at least a portion of the third epitaxial layer 153. The contact plug 180 may include, for example, at least one of metal nitride (e.g., at least one of a titanium nitride film (TiN), a tantalum nitride film (TaN), and a tungsten nitride film (WN)) and a metal material (e.g., at least one of aluminum (Al), tungsten (W) and molybdenum (Mo)).

Figure 4A:
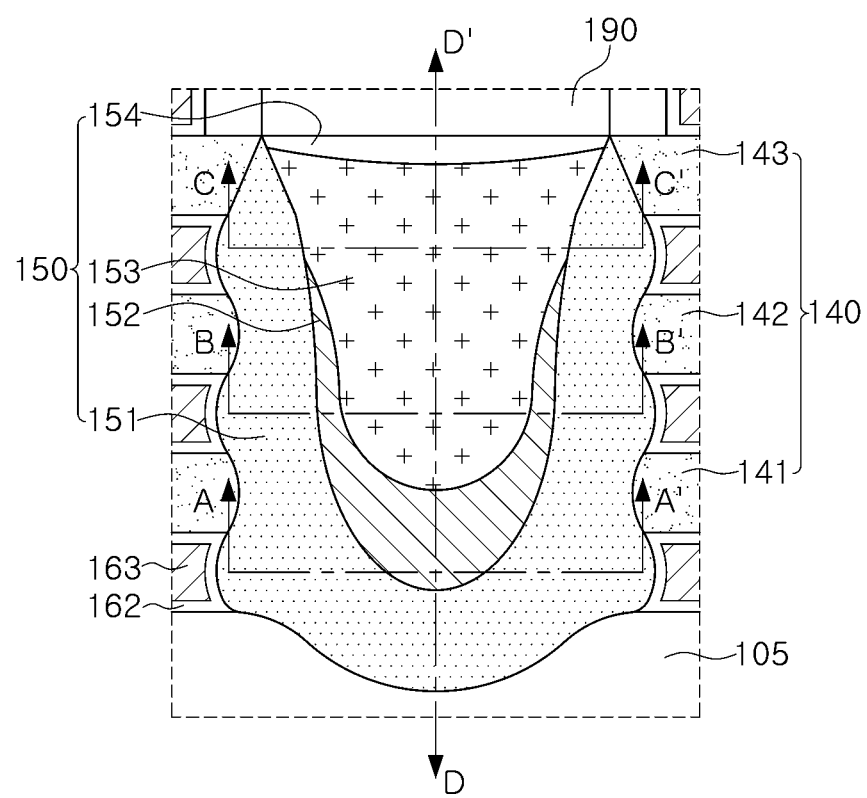
FIG. 4A is an enlarged diagram illustrating a portion of a semiconductor device according to an example embodiment of the present disclosure.

FIG. 4A is an enlarged diagram illustrating a portion of a semiconductor device according to an example embodiment. FIG. 4A illustrates the enlarged diagram in FIG. 3 without the contact plug 180. FIGS. 4B to 4E are graphs illustrating distribution of concentration of germanium (Ge) in a source/drain region in a semiconductor device according to an example embodiment. FIGS. 4B to 4E illustrate concentration profiles of germanium (Ge) in the source/drain region 150 taken along lines A-A', B-B', C-C' and D-D' in FIG. 4A, respectively.

Figure 4B:
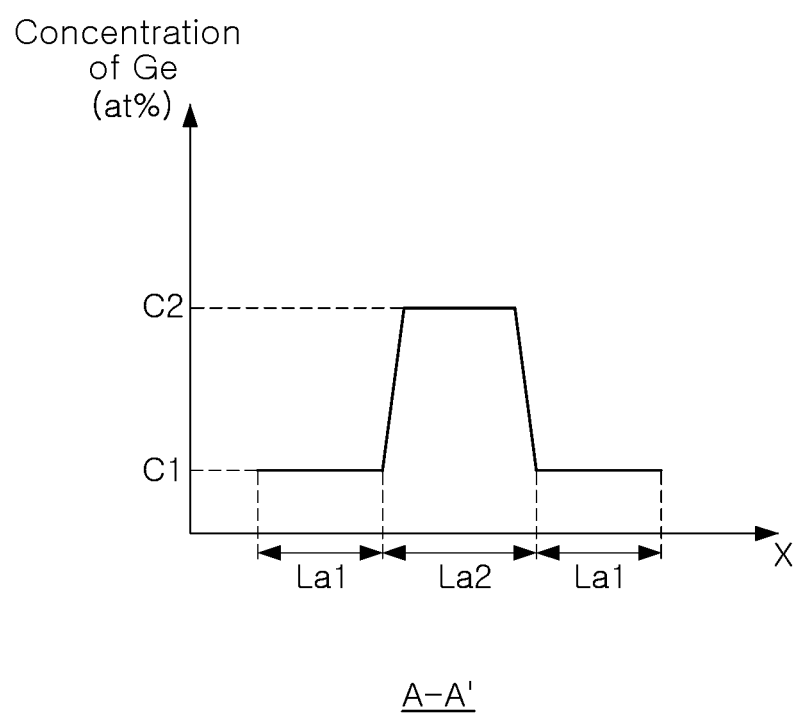
FIGS. 4B to 4E are graphs illustrating distribution of concentrations of germanium (Ge) in a source/drain region in a semiconductor device according to an example embodiment of the present disclosure.

FIG. 4B illustrates a concentration profile of germanium (Ge) in the source/drain region 150 along line A-A' in FIG. 4A. In FIG. 4B, a first section La1 may be a region corresponding to the first epitaxial layer 151, and a second section La2 may be a region corresponding to the second epitaxial layer 152. The first epitaxial layer 151 may include Ge in a first concentration C1, and the second epitaxial layer 152 may include Ge in a second concentration C2 higher than the first concentration C1. As illustrated in FIG. 4B, the source/drain region 150 may not include layers other than the first epitaxial layer 151 and the second epitaxial layer 152 on the level A-A' in FIG. 4A. The third epitaxial layer 153 may be disposed on a level higher than a level of the lower surface of the first channel layer 141, which is a lowermost channel layer.

Figure 4C:
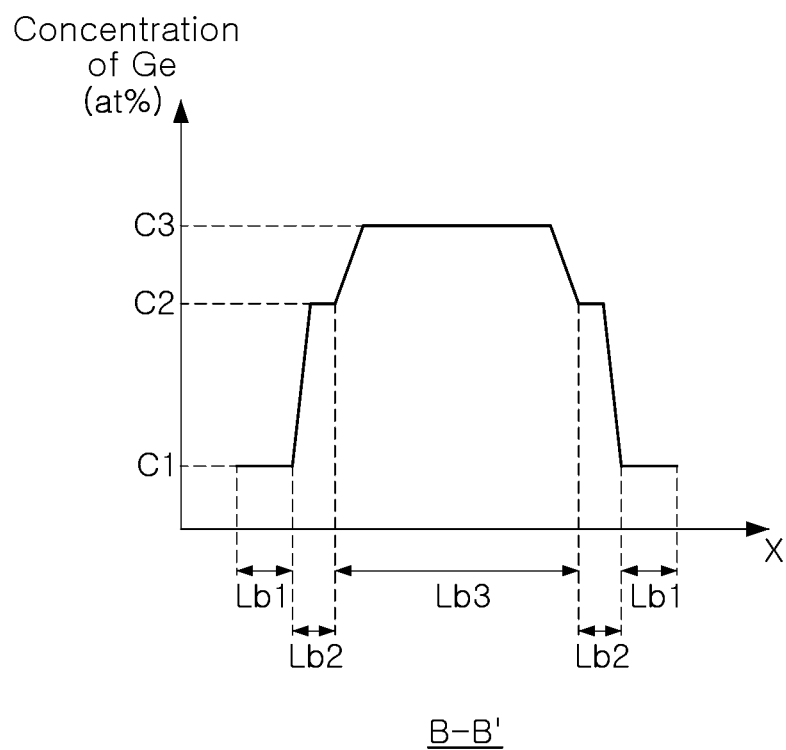

FIG. 4C illustrates a concentration profile of germanium (Ge) in the source/drain region 150 taken along line B-B' in FIG. 4A. In FIG. 4C, a first section Lb1 may be a region corresponding to the first epitaxial layer 151, a second section Lb2 may be a region corresponding to the second epitaxial layer 152, and a third section Lb3 may be a region corresponding to the third epitaxial layer 153. The first epitaxial layer 151 may include Ge in a first concentration C1, the second epitaxial layer 152 may include Ge in a second concentration C2, and the third epitaxial layer 153 may include Ge in a third concentration C3. The concentration of Ge may increase in the order of the first concentration C1, the second concentration C2, and the third concentration C3.

Figure 4D:
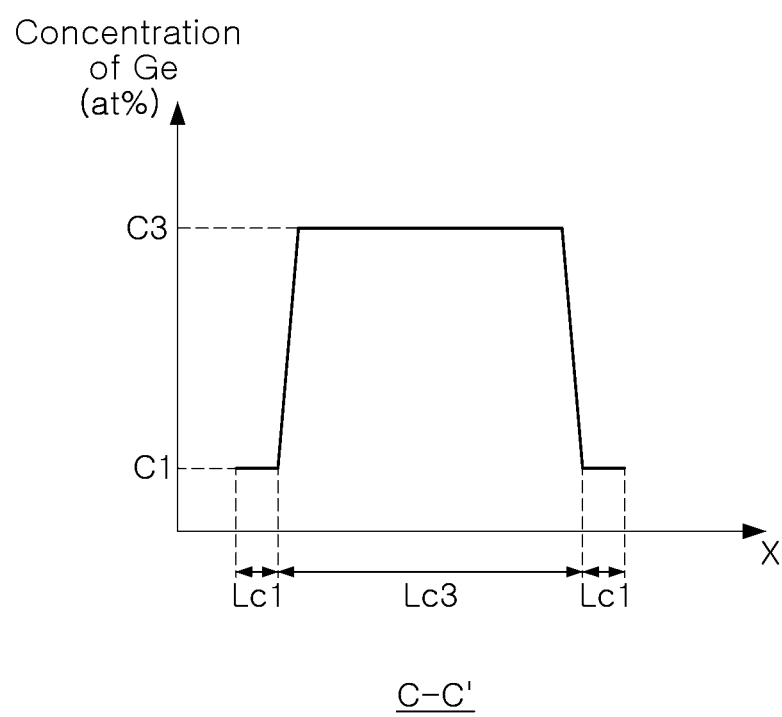

FIG. 4D illustrates a concentration profile of germanium (Ge) in the source/drain region 150 along line C-C' in FIG. 4A. In FIG. 4D, a first section Lc1 may be a region corresponding to the first epitaxial layer 151, and a third section Lc3 may be a section corresponding to the third epitaxial layer 153. The first epitaxial layer 151 may include Ge in a first concentration C1, and the third epitaxial layer 153 may include Ge in a third concentration C3 higher than the first concentration C1. As illustrated in FIG. 4D, on the level C-C' in FIG. 4A, the source/drain region 150 may not include layers other than the first epitaxial layer 151 and the third epitaxial layer 153. The second epitaxial layer 152 may be disposed on a level lower than a level of a lower surface of the uppermost channel layer 143.

The length of the third section Lc3 in FIG. 4D may be greater than the length of the third section Lb3 in FIG. 4C. That is, the third epitaxial layer 153 may have a shape having a width increasing in a direction of being away from the upper surface of the active region 105.

Meanwhile, an example embodiment in which the source/drain region 150 may be symmetrical with respect to the center line D-D' in the first direction X is illustrated in FIGS. 4A to 4D, but an example embodiment thereof is not limited thereto. In example embodiments, the level of the uppermost end of the second epitaxial layer 152 and the width W1 (in FIG. 3) of the second epitaxial layer 152 in the first direction X may be different from each other on both sides of the source/drain region 150 with reference to center line D-D'.

Figure 4E:
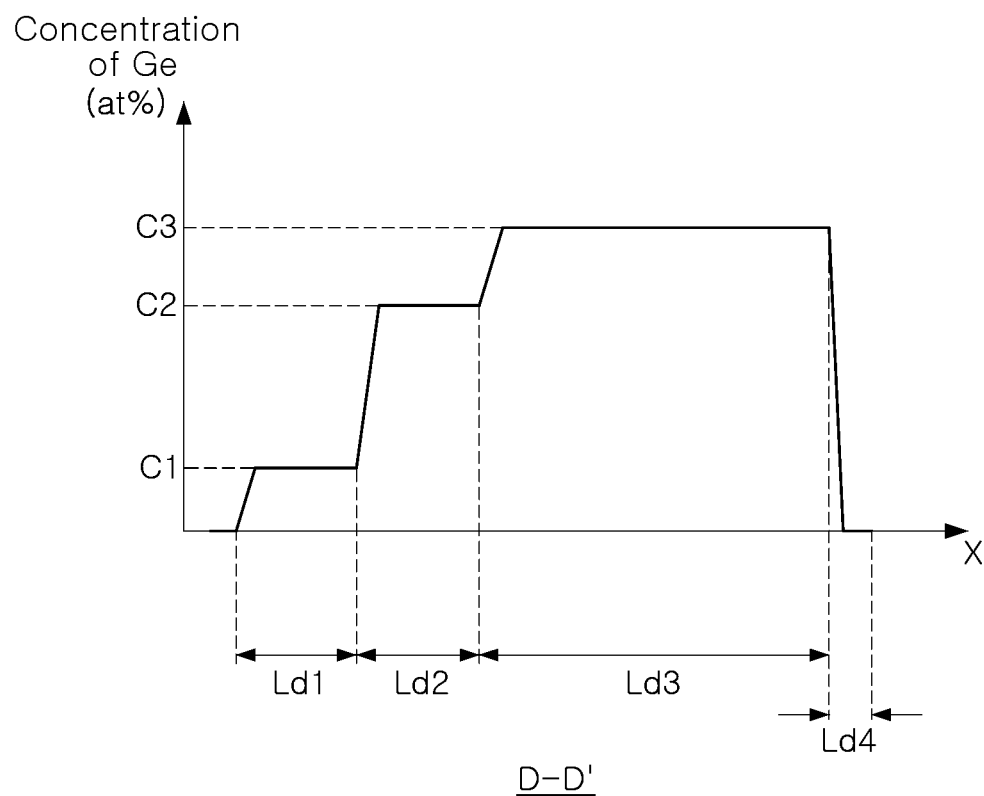

FIG. 4E illustrates a concentration profile of germanium (Ge) in the source/drain region 150 taken along line D-D' in FIG. 4A. Line D-D' in FIG. 4A may be a central line of the source/drain region 150 in the first direction X. In FIG. 4E, a first section Ld1 may be a region corresponding to the first epitaxial layer 151, a second section Ld2 may be a region corresponding to the second epitaxial layer 152, a third section Ld3 may be a region corresponding to the third epitaxial layer 153, and a fourth section Ld4 may be a region corresponding to the fourth epitaxial layer 154. The first epitaxial layer 151 may include Ge in a first concentration C1, the second epitaxial layer 152 may include Ge in a second concentration C2 higher than the first concentration C1, and the third epitaxial layer 153 may include Ge in a third concentration C3 higher than the second concentration C2, and the fourth epitaxial layer 154 may not substantially include Ge. The region before the first section Ld1 may correspond to the substrate 101, and the substrate 101 may not substantially include Ge.

The length of the second section Ld2 in FIG. 4E may be greater than the length of the second section Lb2 in FIG. 4C. That is, the width W1 (in FIG. 3) of the second epitaxial layer 152 in the first direction X may be smaller than the width W2 (in FIG. 3) of the second epitaxial layer 152 in the vertical direction Z.

As illustrated in FIGS. 4B to 4E, the first to fourth epitaxial layers 151, 152, 153, and 154 may have different material compositions (e.g., the concentration of Ge), such that the first to fourth epitaxial layers 151, 152, 153, and 154 may be distinct from each other through the Transmission Electron Microscopy Energy-Dispersive X-ray spectroscopy. In example embodiments, changes in the concentration of Ge in the boundaries between the first to fourth sections may be more abrupt or more gentle.

Figure 5:
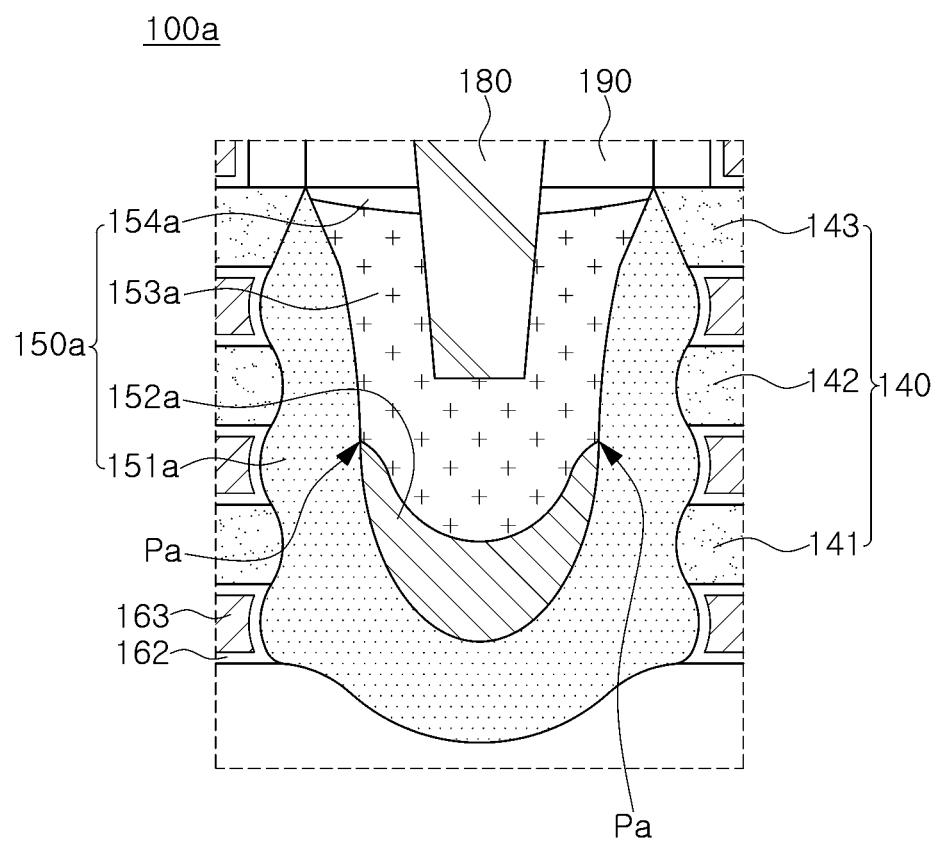
FIG. 5 is an enlarged diagram illustrating a portion of a semiconductor device according to an example embodiment of the present disclosure.
Figure 6:
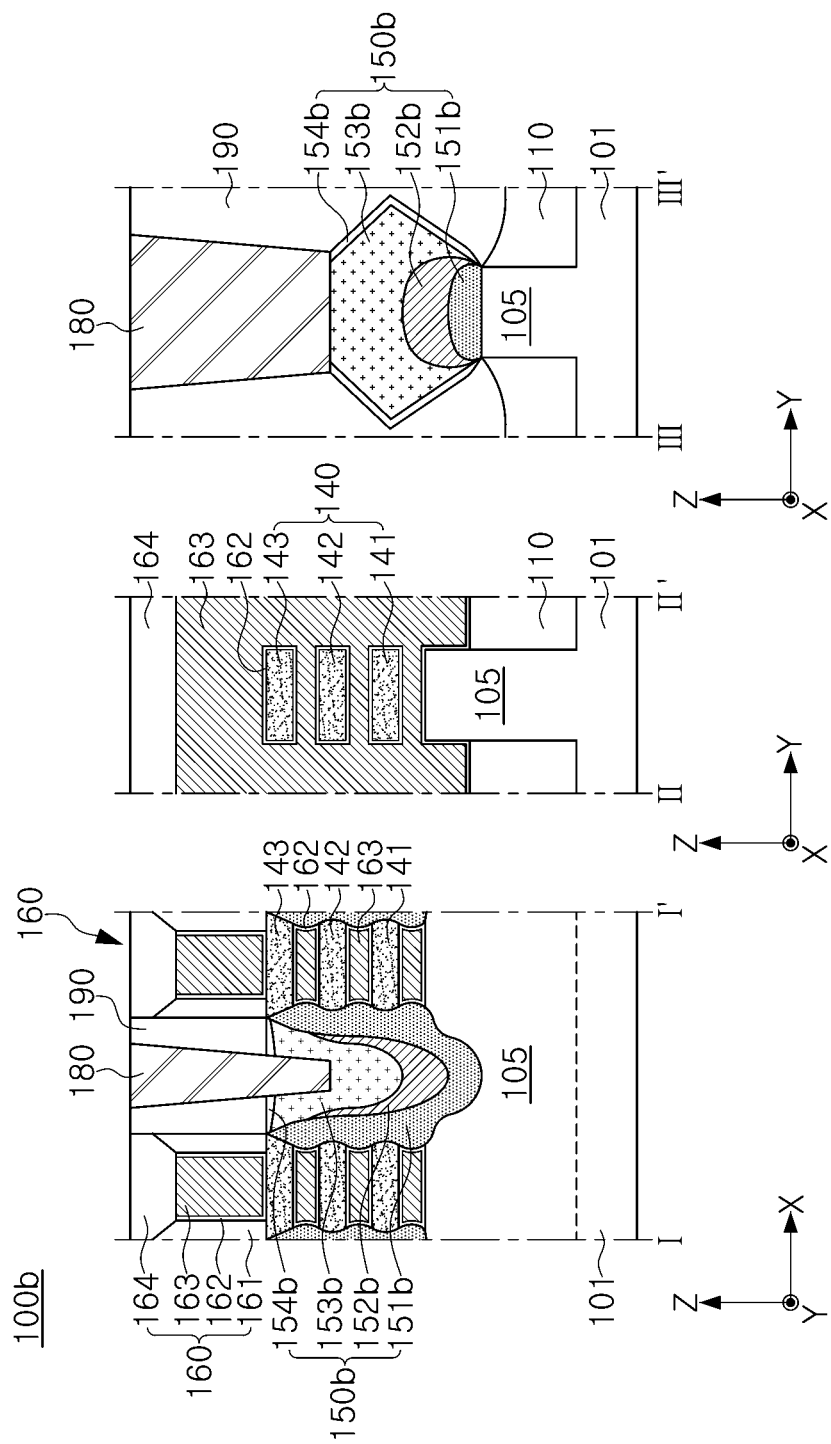
FIG. 6 is a cross-sectional diagram illustrating a semiconductor device according to an example embodiment of the present disclosure.
Figure 7:
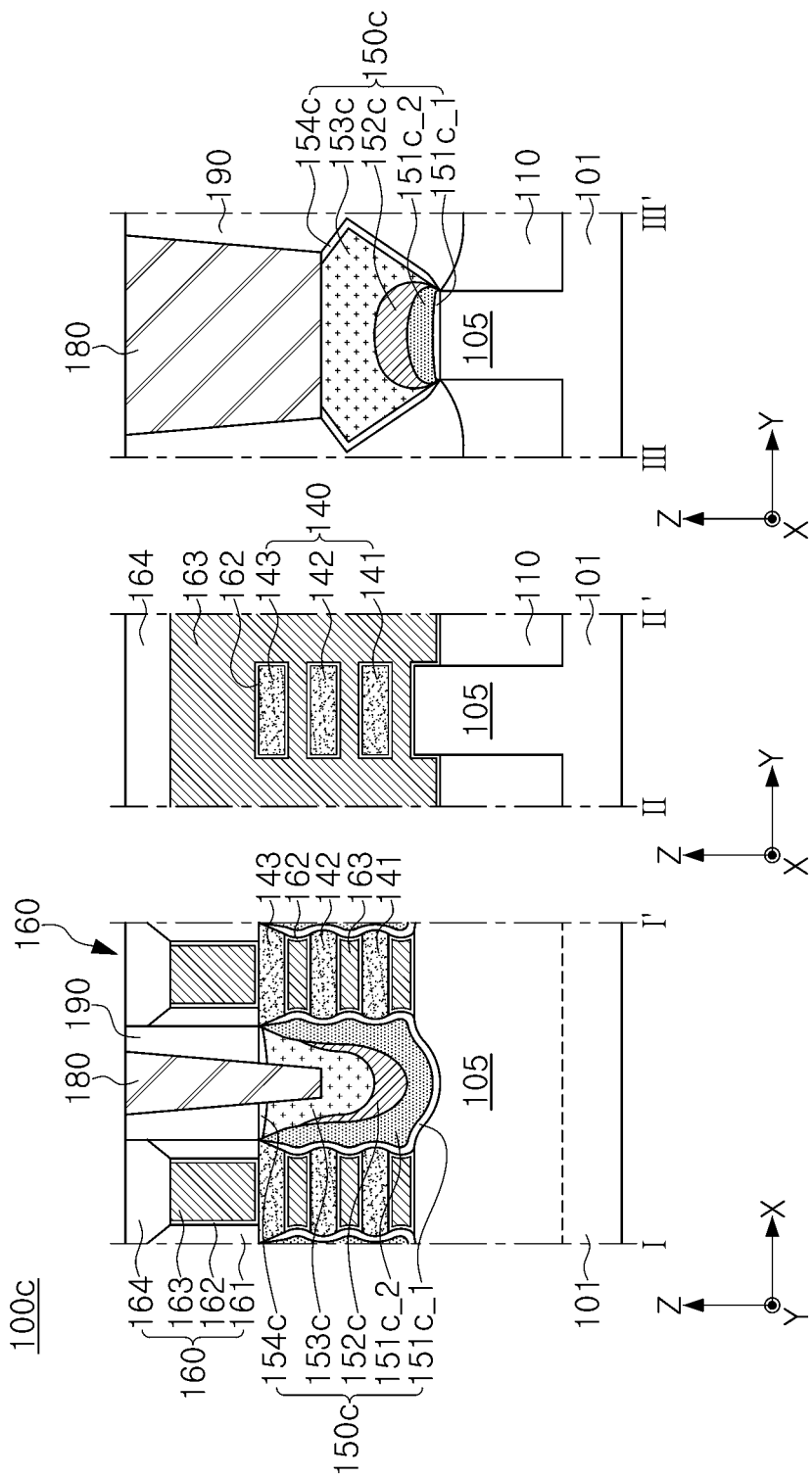
FIG. 7 is a cross-sectional diagram illustrating a semiconductor device according to an example embodiment of the present disclosure.

FIGS. 5 to 7 are cross-sectional diagrams illustrating semiconductor devices according to example embodiments.

In the example embodiment in FIGS. 5 to 7, in the case of having the same reference numerals as those in FIGS. 1 to 3 but having a different denotation, which may be for an example embodiment different from those of FIGS. 1 to 3, and the configurations of the same components may be the same or similar. Differently from the semiconductor device 100 in FIGS. 1 to 3, the shape of the second epitaxial layer 152a may be different from that of the semiconductor device 100a in FIG. 5.

Referring to FIG. 5, an uppermost end of the second epitaxial layer 152a may be disposed between the upper surface of the first channel layer 141, which may be a lowermost channel layer, and a lower surface of the second channel layers 142, which may be a second lowermost channel layer adjacent to the first channel layer 141. The second epitaxial layer 152a may be disposed on a level lower than a level of the lower surface of the second channel layer 142, which is a second lowermost channel layer. A vertical height between the uppermost and lowermost ends of the second epitaxial layer 152a in FIG. 5 may be smaller than a vertical height between the uppermost and lowermost ends of the second epitaxial layer 152 in FIG. 2.

The shape and the position of the second epitaxial layer 152a may be determined depending on a reflow condition in a process of manufacturing the source/drain region 150. For example, when the temperature of the reflow process after the second epitaxial layer 152a is formed is relatively high, the degree of reflow of the second epitaxial layer 152a may increase, and the uppermost end of the second epitaxial layer 152a may be disposed on a lower level. In the semiconductor device 100b in FIG. 6, the shape of the second epitaxial layer 152b may be different from that of the semiconductor device 100 in FIGS. 1 to 3.

Referring to FIG. 6, the lowermost end of the second epitaxial layer 152b may be disposed on a level lower than a level of the uppermost surface of the active region 105b. A maximum width of the second epitaxial layer 152b illustrated in FIG. 6 in the vertical direction Z may be greater than a maximum width of the second epitaxial layer 152 illustrated in FIG. 2 in the vertical direction Z.

The source/drain region 150b illustrated in FIG. 6 may have a relatively large aspect ratio as compared to that of the source/drain region 150 illustrated in FIG. 2. Even in this case, the aspect ratio of the third epitaxial layer 153b may be controlled to be decrease by increasing the width of the second epitaxial layer 152b in the vertical direction Z. Accordingly, dislocations in the third epitaxial layer 153b may be prevented, and performance of the semiconductor device 100b may improve.

In the semiconductor device 100c in FIG. 7, the structure of the first epitaxial layer may be different from that of the semiconductor device 100 in FIGS. 1 to 3. Referring to FIG. 7, the first epitaxial layer may include a first layer 151c_1 and a second layer 151c_2. The first layer 151c_1 and the second layer 151c_2 may include germanium (Ge) of different concentrations. The first layer 151c_1 may include Ge in a lower concentration than that of the second layer 151c_2. In an example embodiment, the first layer 151c_1 may include about 1 at % about 5 at % of Ge, and the second layer 151c_2 may include about 6 at % to about 10 at % of Ge. By controlling the concentration of the first layer 151c_1 disposed on an external side of the source/drain region 150c to be low, a difference in etch selectivity with the sacrificial layer 120 in the process in FIG. 9K may increase. Accordingly, the sacrificial layer 120 may be replaced with the gate structure 160c without damaging the source/drain region 150.

Figure 8:
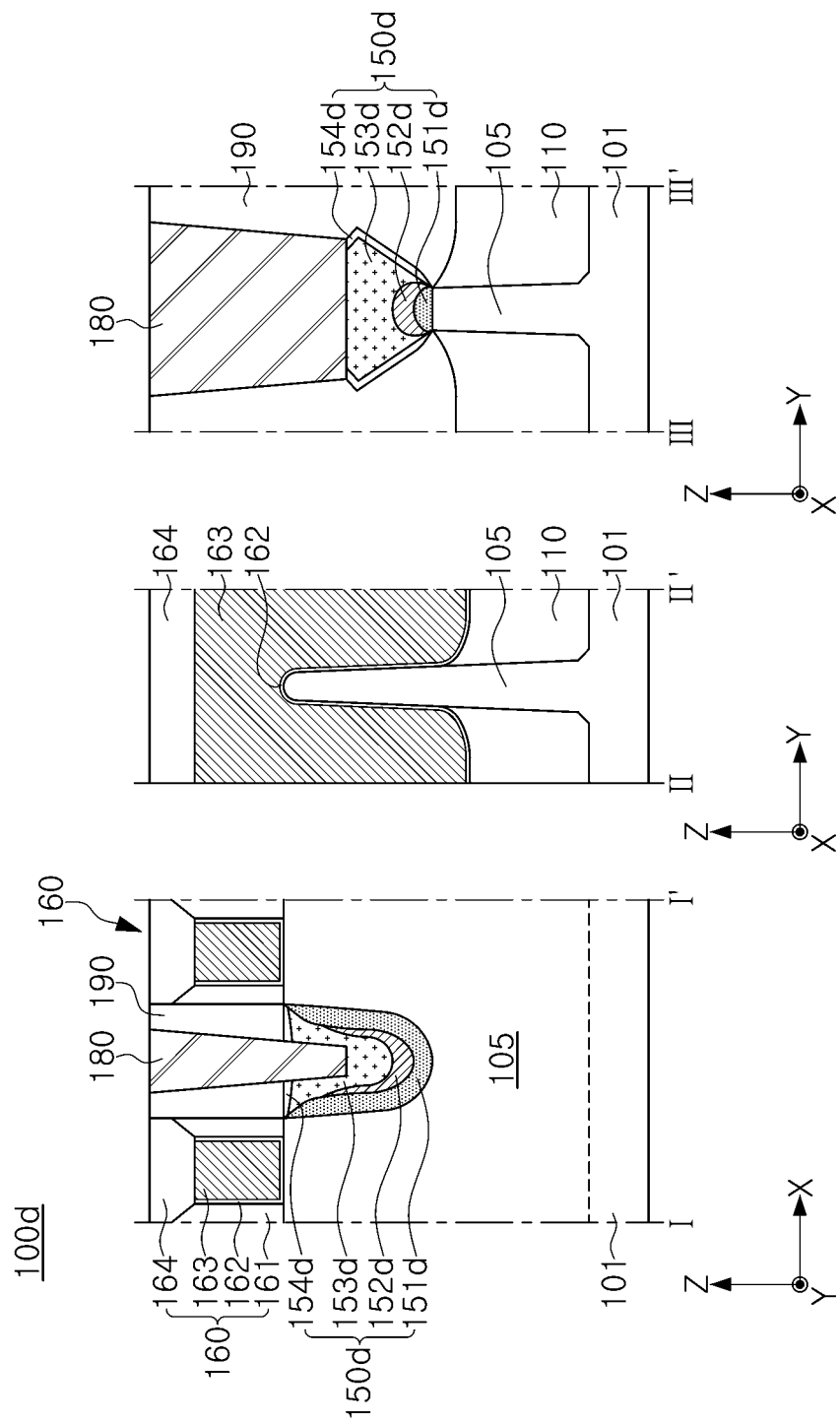
FIG. 8 is a cross-sectional diagram illustrating a semiconductor device according to an example embodiment of the present disclosure.

FIG. 8 is a cross-sectional diagram illustrating a semiconductor device, taken along lines I-I', II-II' and III-III' in FIG. 1, according to an example embodiment. FIG. 8 illustrates only main components of the semiconductor device. Referring to FIG. 8, the semiconductor device 100d may include an active region 105, an isolation layer 110, a source/drain region 150d, a gate structure 160, a contact plug 180, and an interlayer insulating layer 190. The semiconductor device 100d may include a finFET device which may be a transistor having a fin structure of the active region 105. The finFET device may include a transistor disposed around the active region 105 and the gate structure 160 intersecting each other. For example, the finFET device may be a PMOS transistor. Hereinafter, the same reference numerals as those in FIGS. 1 to 3 may indicate corresponding components, and overlapping descriptions will not be provided.

The source/drain regions 150d may be disposed on at least one side of the gate structure 160 in a recess region recessed from the upper surface of the active region 105. The source/drain regions 150d may include a plurality of epitaxial layers, that is, for example, first to fourth epitaxial layers 151d, 152d, 153d, and 154d. The first to fourth epitaxial layers 151d, 152d, 153d, and 154d may be disposed in order in the recess region. The second epitaxial layer 152d may be disposed between the first epitaxial layer 151d and the third epitaxial layer 153d and may lower an aspect ratio of the third epitaxial layer 153d. Accordingly, dislocation in the source/drain region 150d may be prevented, such that performance of the semiconductor device 100d may improve.

Figure 9A:
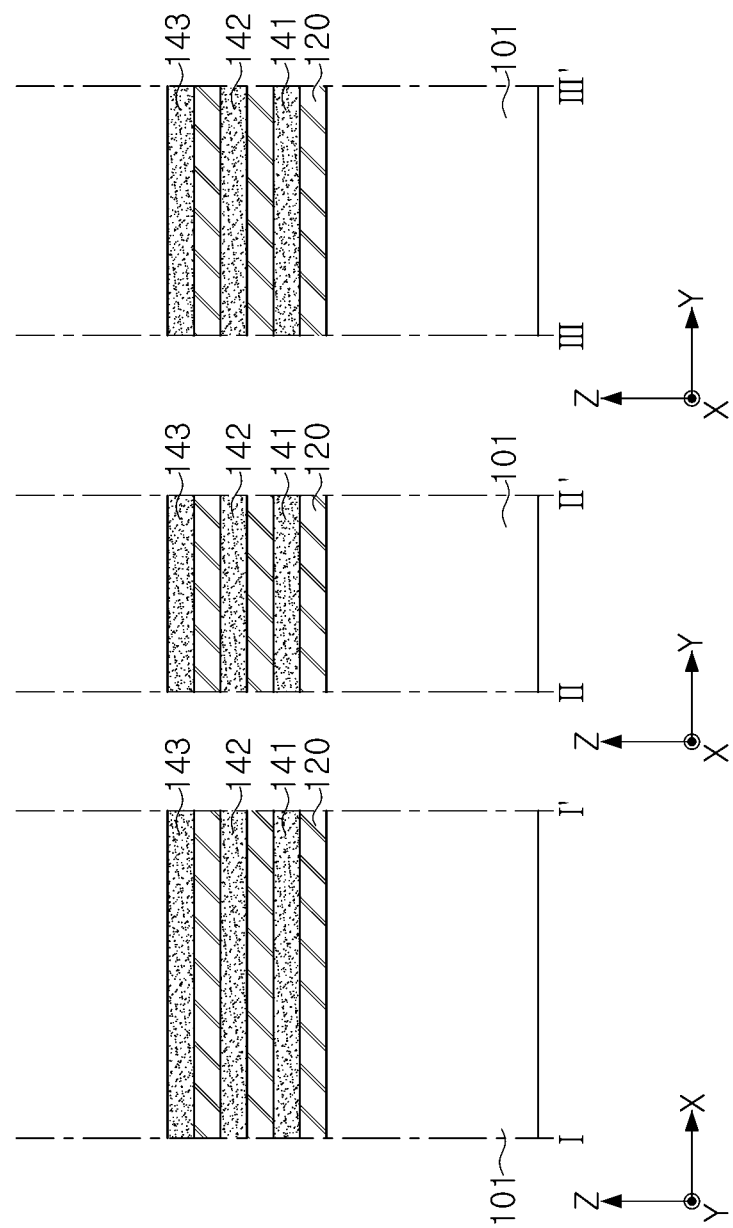
FIGS. 9A to 9K are cross-sectional diagrams illustrating processes performed during a method of manufacturing a semiconductor device in order according to an example embodiment of the present disclosure.

FIGS. 9A to 9K are cross-sectional diagrams illustrating processes of a method of manufacturing a semiconductor device in order according to an example embodiment. FIGS. 9A to 9K illustrate an example embodiment of a method of manufacturing the semiconductor device in FIGS. 1 to 3, and illustrate cross-sectional surfaces corresponding to FIG. 2. Referring to FIG. 9A, sacrificial layers 120 and channel layers 141, 142, and 143 may be alternately stacked on a substrate 101.

The sacrificial layers 120 may be replaced with the gate dielectric layer 162 and the gate electrode layer 163 as illustrated in FIG. 2 through a subsequent process. The sacrificial layers 120 may be formed of a material having etch selectivity with respect to the channel layers 141, 142, and 143. The channel layers 141, 142, and 143 may include a material different from that of the sacrificial layers 120. In an example embodiment, the channel layers 141, 142, and 142 may include silicon (Si), and the sacrificial layers 120 may include silicon germanium (SiGe).

The sacrificial layers 120 and the channel layers 141, 142, and 143 may be formed by performing an epitaxial growth process using the substrate 101 as a seed. Each of the sacrificial layers 120 and the channel layers 141, 142, and 143 may have a thickness in a range of about 1 Å to 100 nm. The number of layers of the channel layers 141, 142, and 143 alternately stacked with the sacrificial layer 120 may be varied in example embodiments.

Figure 9B:
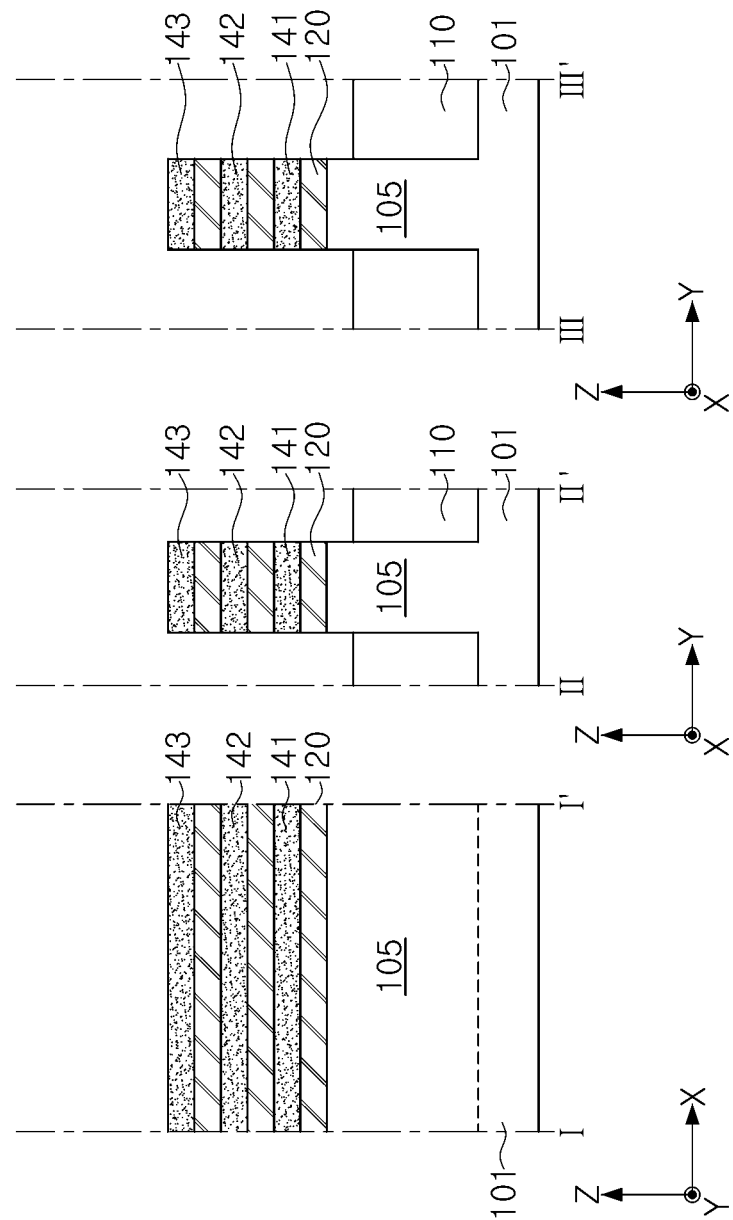

Referring to FIG. 9B, active structures may be formed by removing the stack structure of the sacrificial layers 120 and the channel layers 141, 142, and 143 and a portion of the substrate 101. The active structure may include sacrificial layers 120 and channel layers 141, 142, and 143 alternately stacked with each other, and may further include an active region 105 protruding to an upper surface of the substrate 101 by removing a portion of the substrate 101. The active structures may be formed in a linear shape extending in one direction, that is, for example, the X-direction, and may be spaced apart from each other in the Y-direction.

In the region from which a portion of the substrate 101 is removed, an insulating material may be filled and may be recessed to allow the active region 105 to protrude, thereby forming the device isolation layers 110. An upper surface of the device isolation layers 110 may be formed to be lower than an upper surface of the active region 105.

Figure 9C:
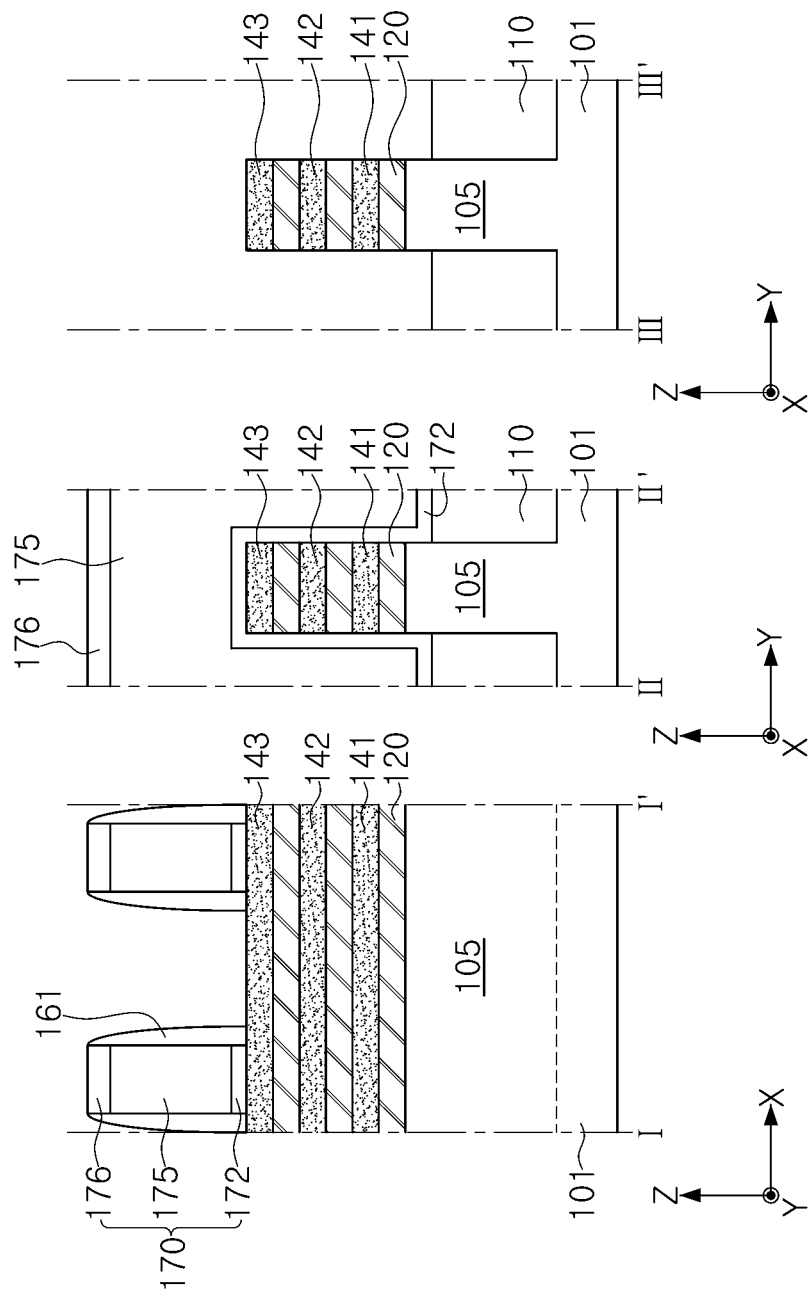

Referring to FIG. 9C, sacrificial gate structures 170 and spacer layers 161 may be formed on the active structures. The sacrificial gate structures 170 may be sacrificial structures formed in a region in which the gate dielectric layer 162 and the gate electrode layer 163 are disposed on the channel structure 140 as illustrated in FIG. 2 through a subsequent process. The sacrificial gate structure 170 may include first and second sacrificial gate layers 172 and 175 and a mask pattern layer 176 stacked in order. The first and second sacrificial gate layers 172 and 175 may be patterned using a mask pattern layer 176. The first and second sacrificial gate layers 172 and 175 may be an insulating layer and a conductive layer, respectively. For example, the first sacrificial gate layer 172 may include silicon oxide, and the second sacrificial gate layer 175 may include polysilicon. The mask pattern layer 176 may include silicon nitride. The sacrificial gate structures 170 may have a linear shape intersecting the active structures and extending in one direction. The sacrificial gate structures 170 may extend, for example, in a Y-direction and may be spaced apart from each other in the X-direction.

Spacer layers 161 may be formed on both sidewalls of the sacrificial gate structures 170. The spacer layers 161 may be formed by forming a film having a uniform thickness along upper and side surfaces of the sacrificial gate structures 170 and the active structures and performing anisotropic etching. The spacer layers 161 may be formed of a low-k material, and may include, for example, at least one of SiO, SiN, SiCN, SiOC, SiON, and SiOCN.

Figure 9D:
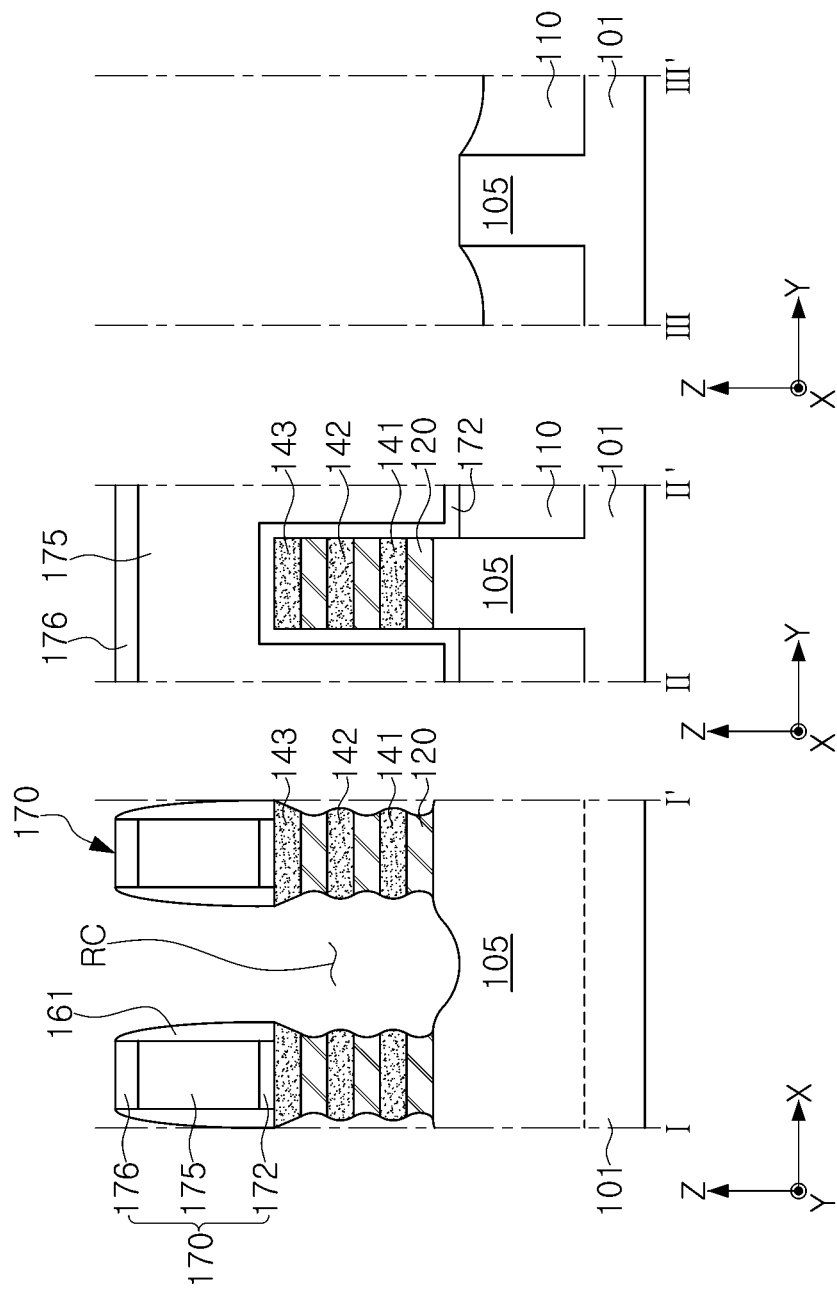

Referring to FIG. 9D, channel structures 140 may be formed by forming a recess region RC by removing the exposed sacrificial layers 120 and the channel layers 141, 142, and 143 between the sacrificial gate structures 170. The exposed sacrificial layers 120 and the channel layers 141, 142, and 143 may be removed using the sacrificial gate structures 170 and the gate spacer layers 161 as masks. The remaining sacrificial layers 120 may be removed by a predetermined depth from the side surface in the X-direction, and may have inwardly curved side surfaces. The side surfaces of the remaining channel layers 141, 142, and 143 in the X-direction may be etched to have outwardly curved side surfaces. However, the shapes of the side surfaces of the sacrificial layers 120 and the channel layers 141, 142, and 143 are not limited to the illustrated example. The side surfaces of the sacrificial layers 120 and the channel layers 141, 142, and 143 may be formed to be coplanar with each other in a direction perpendicular to the upper surface of the substrate 101.

Figure 9E:
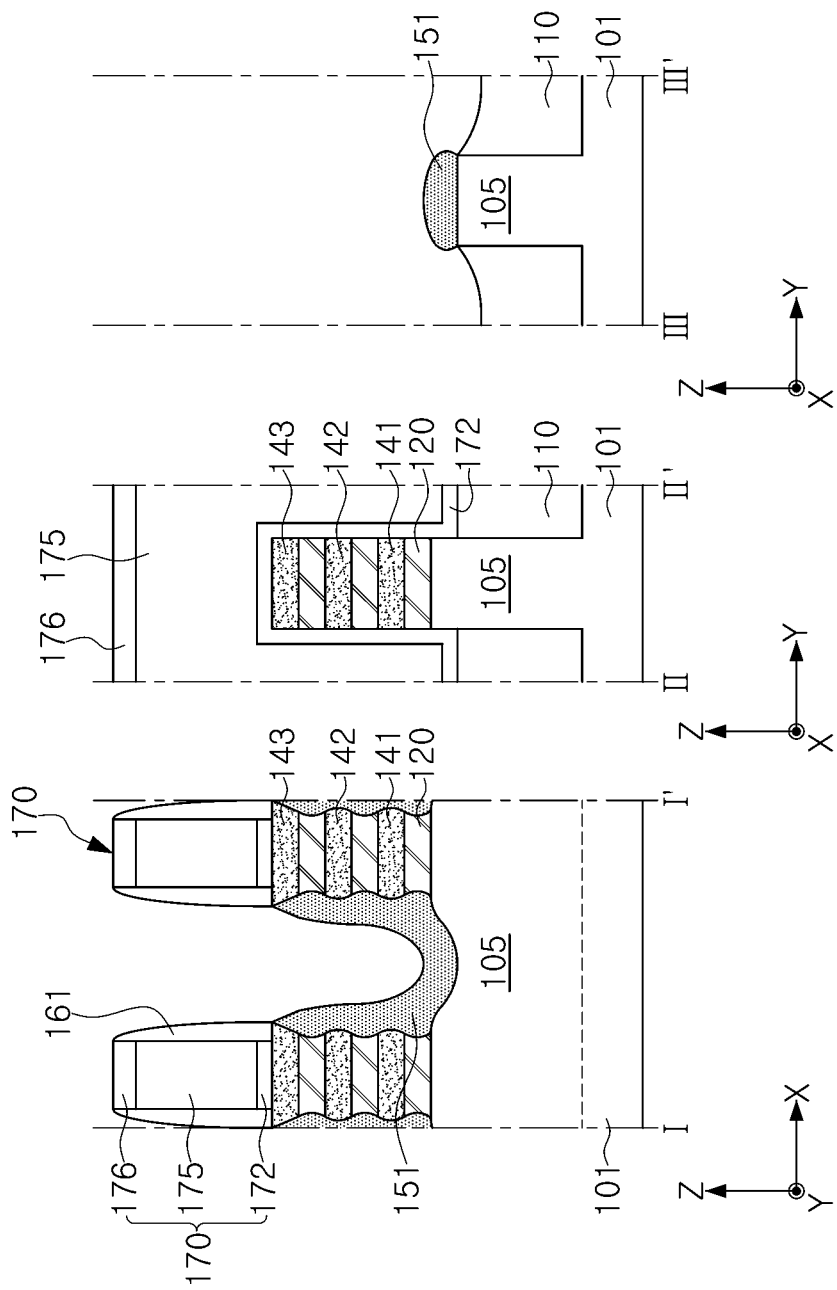

Referring to FIG. 9E, the first epitaxial layer 151 may be formed in the recess region RC. The first epitaxial layer 151 may extend to be in contact with the channel layers 141, 142, and 143 and the sacrificial layers 120 in the recess region RC. Accordingly, the upper surface of the first epitaxial layer 151 may be formed in a recessed shape, and may be formed to have an almost U-shape. A surface of the first epitaxial layer 151 in contact with the channel layers 141, 142, and 143 and the sacrificial layers 120 may have a wavy shape. The lowermost end of the upper surface 151T of the first epitaxial layer 151 may be disposed on a level higher than a level of the lower surface of the lowermost sacrificial layer 120.

The first epitaxial layer 151 may include silicon germanium (SiGe) doped with a group 3 element. According to an example embodiment, the first epitaxial layer 151 may include one of boron (B), aluminum (Al), gallium (Ga), indium (In), and thallium (Tl). The first epitaxial layer 151 may be formed by supplying silicon (Si) and germanium (Ge) source gases while supplying a carrier gas. In an example embodiment, the carrier gas may be hydrogen (H2) gas, the silicon (Si) source gas may be, for example, silane ($SiH_4$), dichlorosilane ($SiH_2Cl_2$; DCS) or chlorosilane ($SiH_3Cl$; MCS), the germanium (Ge) source gas may be, for example, germanium tetrahydride ($GeH_4$). Second and third epitaxial layers may be formed in a similar manner.

The first epitaxial layer 151 may include germanium (Ge) having a lower concentration than that of the sacrificial layers 120. In an example embodiment, the first epitaxial layer 151 may include Ge in a concentration of about 5 at % to about 8 at %. The first epitaxial layer 151 may include Ge in a lower concentration than that of the sacrificial layers 120 and may have a smaller etch selectivity than that of the sacrificial layers. Accordingly, in the subsequent process in FIG. 9K, the sacrificial layers 120 may be selectively removed, and the source/drain regions 150 protected by the first epitaxial layer 151 may remain.

Figure 9F:
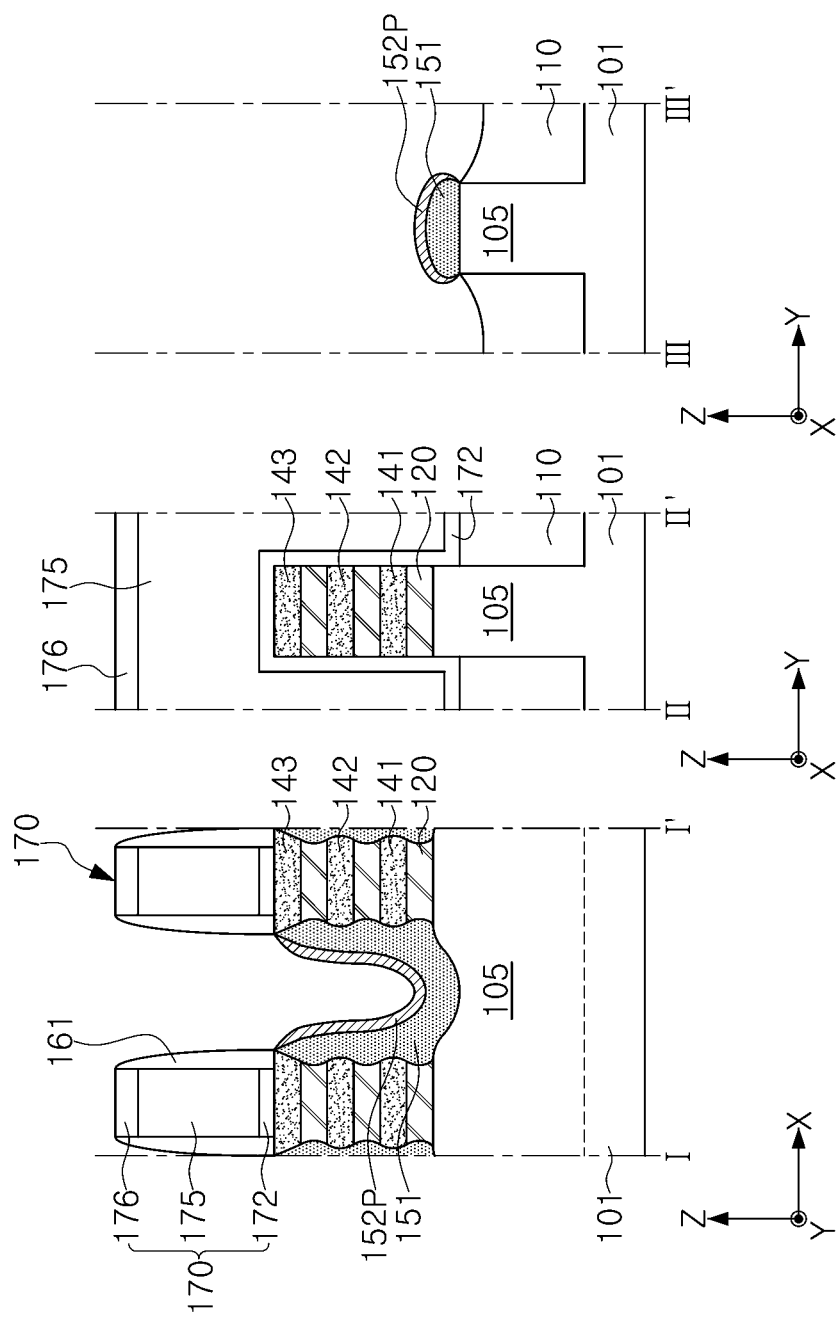

Referring to FIG. 9F, a second preliminary epitaxial layer 152P may be formed on the first epitaxial layer 151. The second preliminary epitaxial layer 152P may be conformally formed on the upper surface of the first epitaxial layer 151 to have a substantially uniform thickness. Accordingly, the upper surface of the second preliminary epitaxial layer 152P may have a recessed shape similar to the upper surface of the first epitaxial layer 151. The second preliminary epitaxial layer 152P may be formed to cover the entire upper surface of the first epitaxial layer 151, but an example embodiment thereof is not limited thereto. In example embodiments, the second preliminary epitaxial layer 152P may be formed to cover only a portion of the upper surface of the first epitaxial layer 151.

The second preliminary epitaxial layer 152P may include silicon germanium (SiGe) doped with a group 3 element. According to an example embodiment, the first epitaxial layer 151 may include one of boron (B), aluminum (Al), gallium (Ga), indium (In), and thallium (Tl). The second preliminary epitaxial layer 152P may include Ge in a concentration higher than that of the first epitaxial layer 151. In an example embodiment, the second preliminary epitaxial layer 152P may include Ge in a concentration of about 40 at % to about 45 at %.

Figure 9G:
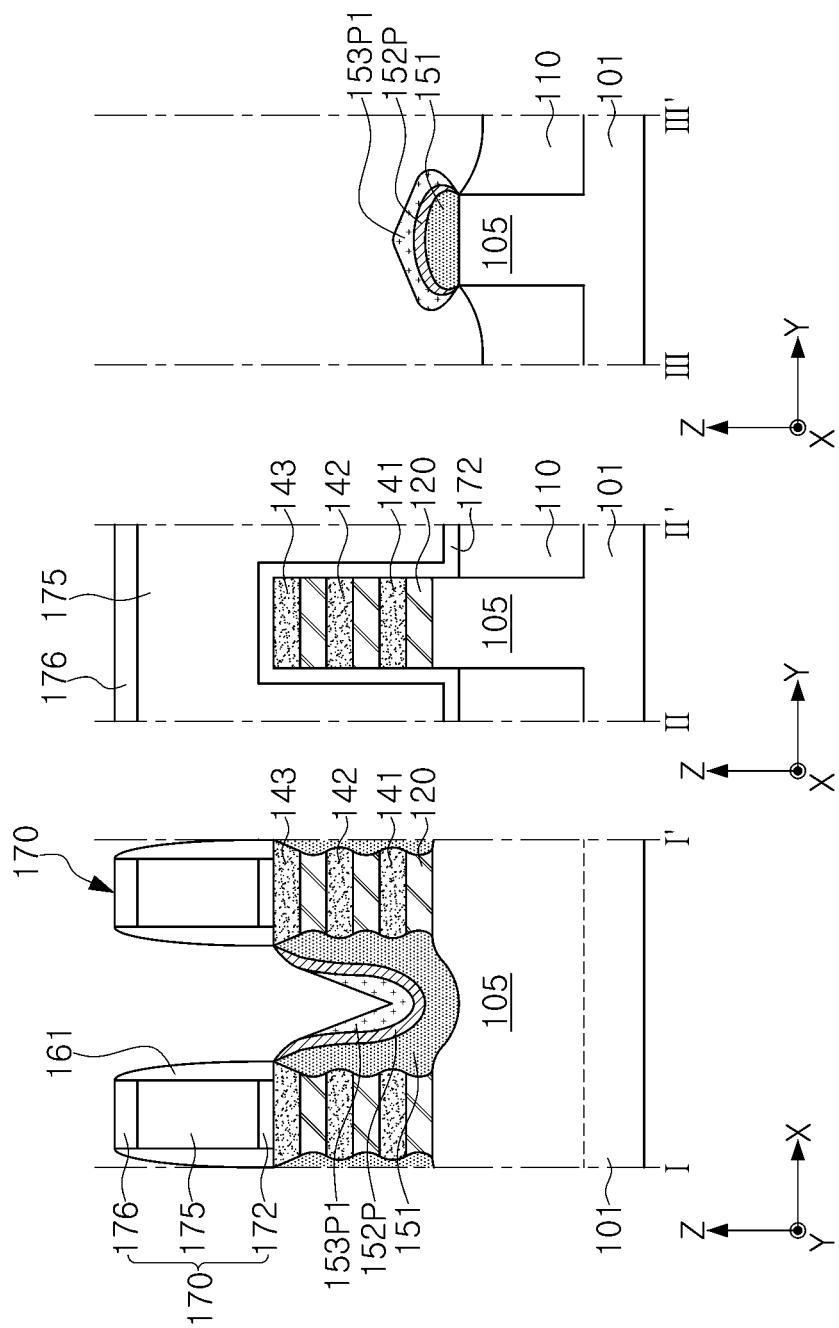

Referring to FIG. 9G, a third lower epitaxial layer 153P1 may be formed on the second preliminary epitaxial layer 152P. The third lower epitaxial layer 153P1 may include silicon germanium (SiGe) doped with a group 3 element. According to an example embodiment, the first epitaxial layer 151 may include one of boron (B), aluminum (Al), gallium (Ga), indium (In), and thallium (Tl). The third lower epitaxial layer 153P1 may include Ge in a concentration higher than that of the second preliminary epitaxial layer 152P. In an example embodiment, the third lower epitaxial layer 153P1 may include Ge in a concentration of about 50 at % to about 55 at %. The third lower epitaxial layer 153P1 may be formed to have a volume of about 35% to about 45% of the third epitaxial layer 153 in the final structure illustrated in FIG. 2.

As illustrated in FIG. 9G, a defect illustrated in a V-shape may be formed on the upper surface of the third lower epitaxial layer 153P1. However, the defect of the third lower epitaxial layer 153P1 may be removed by the process in FIG. 9H.

Figure 9H:
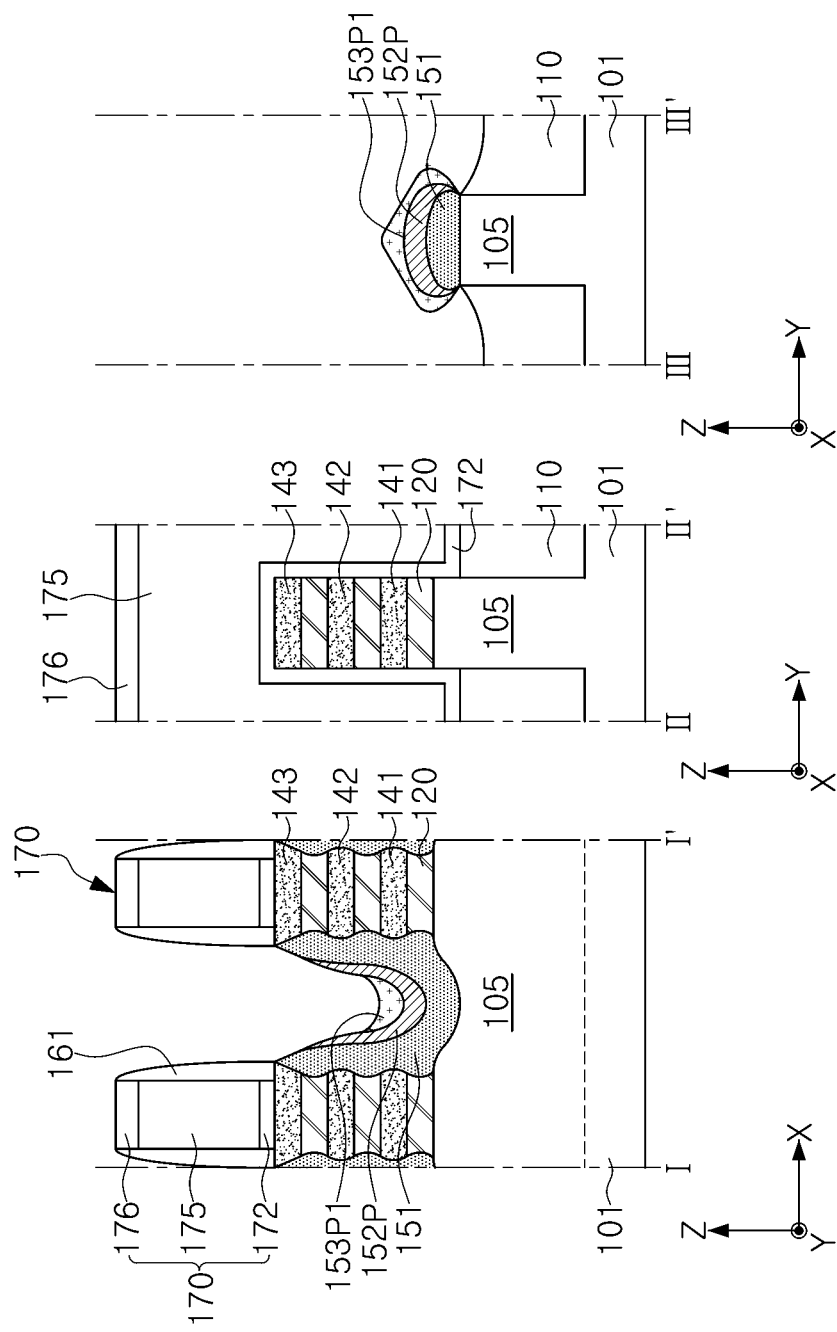

Referring to FIG. 9H, the second preliminary epitaxial layer 152P and the third lower epitaxial layer 153P1 may be reflowed. For example, heat may be supplied to the first epitaxial layer 151, the second preliminary epitaxial layer 152P, and the third lower epitaxial layer 153P1 grown in the recess region together with a carrier gas. The carrier gas may be, for example, hydrogen ($H_2$) gas. When heat is supplied to the epitaxial layers grown in the recess region along with a carrier gas, atoms of each epitaxial layer may move in a direction in which the total surface energy is lowered, that is, for example, in a vertical downward direction (−Z).

Mobility of atoms may be different depending on the concentrations of Ge of the epitaxial layers. For example, the third lower epitaxial layer 153P1 and the second preliminary epitaxial layer 152P including Ge in a relatively high concentration may have atomic mobility greater than that of the first epitaxial layer 151 including Ge in a relatively low concentration. In the example, in the third lower epitaxial layer 153P1 and the second preliminary epitaxial layer 152P, surface atoms may be diffused and may reflow, whereas in the first epitaxial layer 151, atoms may hardly move. Since the third epitaxial layer 153P1 includes Ge in a higher concentration than that of the second epitaxial layer 152P, the atomic mobility of the third epitaxial layer 153P1 may be greater than the atomic mobility of the second epitaxial layer 152P.

The third lower epitaxial layer 153P1 may have a gently curved shape as illustrated in FIG. 9H by diffusion of surface atoms. Accordingly, dislocations formed on the surface of the third lower epitaxial layer 153P1 formed in the process in FIG. 9G may be removed.

In the second preliminary epitaxial layer 152P, surface atoms may be diffused in the vertical downward direction (−Z), such that the level of the uppermost portion may be lowered. Accordingly, a portion of the internal surface of the first epitaxial layer 151 may be exposed. As surface atoms of the second preliminary epitaxial layer 152P move to the central region, a thickness in the vertical direction Z in the central region of the second preliminary epitaxial layer 152P may increase. The thickness in the horizontal direction X in the edge region extending from the central region of the second preliminary epitaxial layer 152P may decrease. As the second preliminary epitaxial layer 152P is deformed into the shape as above, an aspect ratio of the space in which the third preliminary epitaxial layer 153P2 formed in the process in FIG. 9I is formed may be relatively reduced.

Figure 9I:
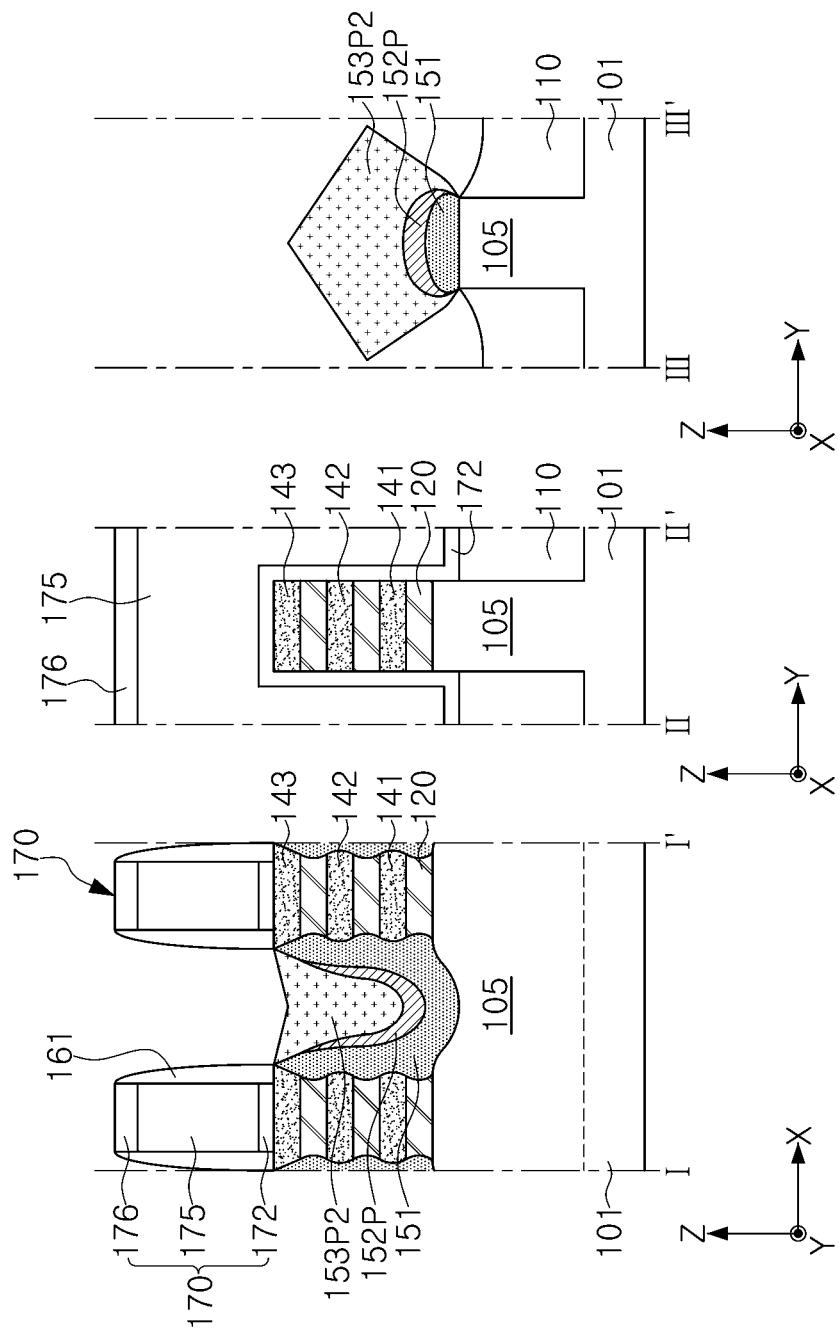

Referring to FIG. 9I, silicon-germanium (SiGe) may be epitaxially grown on the third lower epitaxial layer 153P1, thereby forming a third preliminary epitaxial layer 153P2. The third preliminary epitaxial layer 153P2 may be formed to be in contact with the second preliminary epitaxial layer 152P and the first epitaxial layer 151. The third preliminary epitaxial layer 153P2 may be formed to a level below the upper surface of the third channel layer 143.

The third preliminary epitaxial layer 153P2 may be formed of a material having the same composition as that of the third lower epitaxial layer 153P1. For example, the third lower epitaxial layer 153P1 may include silicon germanium (SiGe) doped with a group 3 element, and may include Ge in a concentration of about 50 at % to about 55 at %. Since the third preliminary epitaxial layer 153P2 and the third lower epitaxial layer 153P1 have the same composition, an interfacial surface between the third preliminary epitaxial layer 153P2 may not be distinct.

Similarly the third lower epitaxial layer 153P1, a V-shaped defect may be formed on the upper surface of the third preliminary epitaxial layer 153P2. However, the defect of the third preliminary epitaxial layer 153P2 may be removed by the process in FIG. 9J.

Figure 9J:
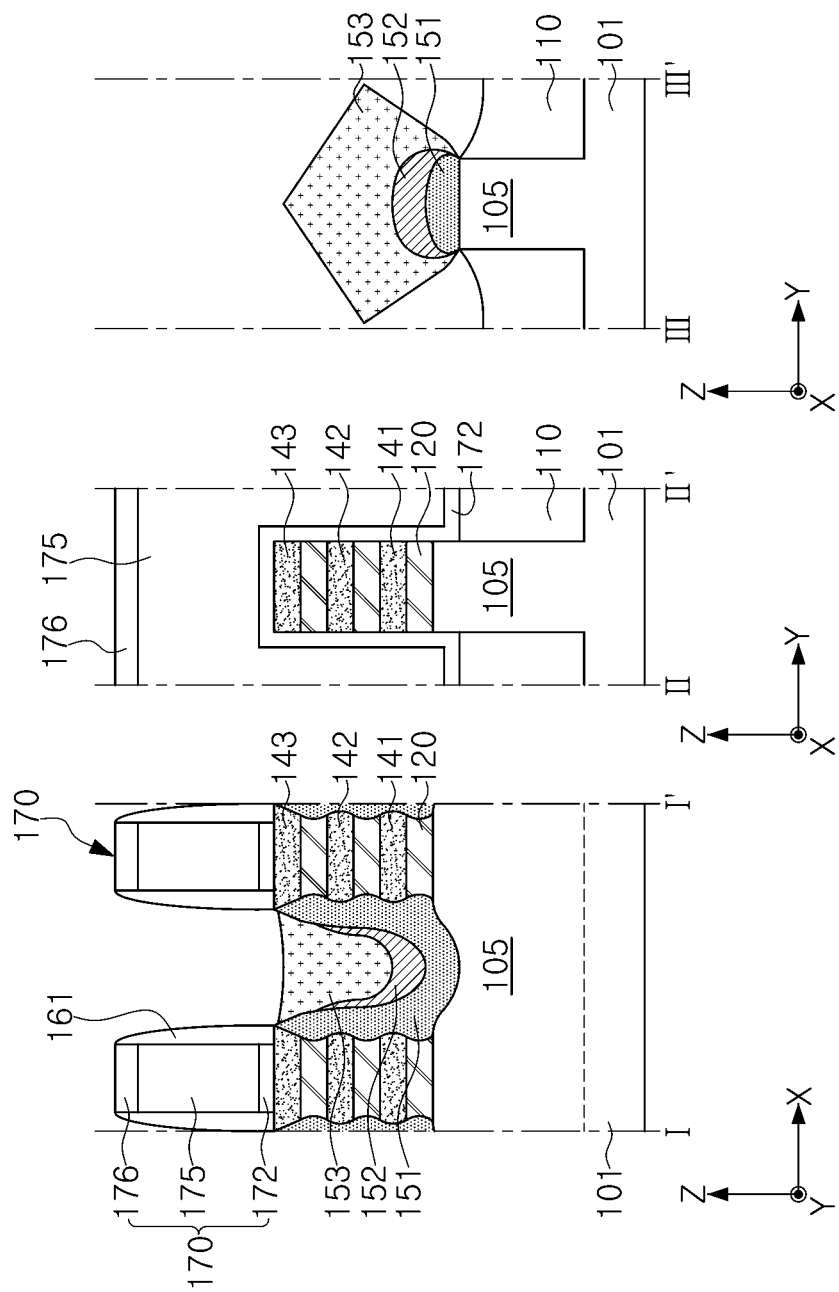

Referring to FIG. 9J, the second preliminary epitaxial layer 152P and the third preliminary epitaxial layer 153P2 may be reflowed. The surface atoms of the third preliminary epitaxial layer 153P2 may be diffused and the third preliminary epitaxial layer 153P2 may have a gently curved shape as illustrated in FIG. 9J. Accordingly, dislocations formed on the surface of the third preliminary epitaxial layer 153P2 formed in the process in FIG. 9I may be removed. The third preliminary epitaxial layer 153P2 from which dislocations are removed may be included in the third epitaxial layer 153.

In the second preliminary epitaxial layer 152P, surface atoms may be further diffused in the vertical downward direction (−Z) and the second epitaxial layer 152 may be formed. In the example embodiment, the second preliminary epitaxial layer 152P may reflow to the extent that the level of the uppermost end may be disposed on a level between the lower surface of the third channel layer 143 and the upper surface of the second channel layer 142, but an example embodiment thereof is not limited thereto. The second preliminary epitaxial layer 152P may be reflowed to the extent that the level of the uppermost end may be disposed on a level between the lower surface of the second channel layer 142 and the upper surface of the first channel layer 141, for example. In this case, the second epitaxial layer 152a as illustrated in FIG. 5 may be formed. The degree to which the second preliminary epitaxial layer 152P is reflowed may be controlled according to a concentration of Ge of the second preliminary epitaxial layer 152P, a reflow condition, and the like.

Figure 9K:
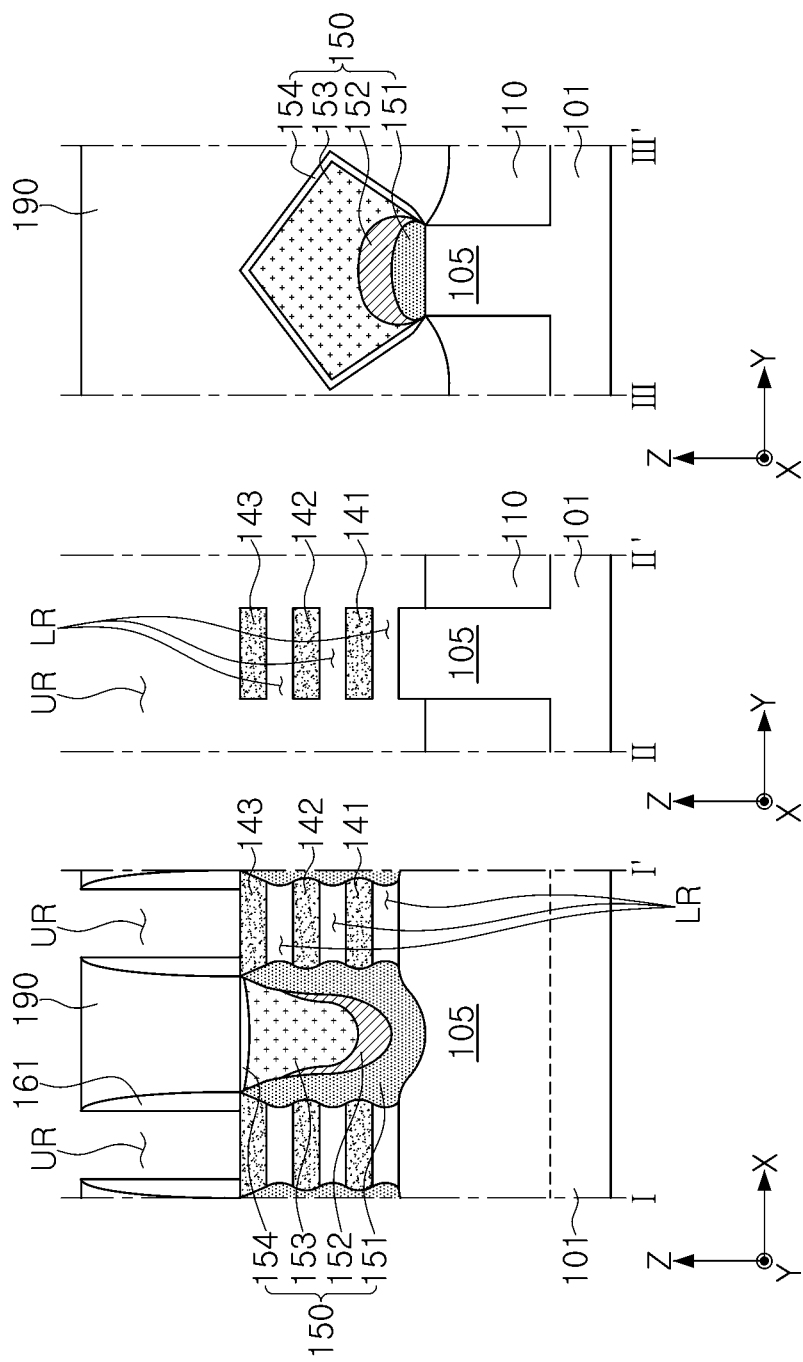

Referring to FIG. 9K, a fourth epitaxial layer 154 may be formed on the third epitaxial layer 153. The fourth epitaxial layer 154 may include silicon (Si) doped with a group 3 element. For example, the fourth epitaxial layer 154 may include one of boron (B), aluminum (Al), gallium (Ga), indium (In), and thallium (Tl). In an example embodiment, the fourth epitaxial layer 154 may include silicon (Si) doped with boron (B), and germanium (Ge) may not be substantially included in the fourth epitaxial layer 154.

An interlayer insulating layer 190 may be formed between sacrificial gate structures 170 adjacent to each other on the fourth epitaxial layer 154, and the sacrificial layers 120 and the sacrificial gate structure 170 may be removed. The interlayer insulating layer 190 may be formed by forming an insulating layer covering the sacrificial gate structures 170 and the source/drain regions 150 and performing a planarization process.

The sacrificial layers 120 and the sacrificial gate structures 170 may be selectively removed with respect to the spacer layers 161, the interlayer insulating layer 190, and the channel layers 141, 142, and 143. First, the upper gap regions UR may be formed by removing the sacrificial gate structures 170, and the lower gap regions LR may be formed by removing the sacrificial layers 120 exposed through the upper gap regions UR. For example, when the sacrificial layers 120 include silicon germanium (SiGe) and the channel layers 141, 142, and 143 include silicon (Si), the sacrificial layers 120 may be selectively removed by performing a wet etching process using peracetic acid as an etchant. During the removal process, the source/drain regions 150 may be protected by the first epitaxial layer 151 formed in an outermost region and having a low selective etch ratio.

Thereafter, referring back to FIG. 2, the gate structure 160 may be formed in the upper gap regions UR and the lower gap regions LR. The gate dielectric layer 162 may be formed to conformally cover internal surfaces of the upper gap regions UR and the lower gap regions LR. The gate electrode layer 163 may be formed to completely fill the upper gap regions UR and the lower gap regions LR. The gate electrode layer 163 and the spacer layers 161 may be removed by a predetermined depth from an upper portion in the upper gap regions UR. A gate capping layer 164 may be formed in a region of the upper gap regions UR from which the gate electrode layer 163 and the spacer layers 161 are removed. Accordingly, the gate structure 160 including the gate dielectric layer 162, the gate electrode layer 163, the spacer layers 161, and the gate capping layer 164 may be formed.

Thereafter, a contact hole may be formed by patterning the interlayer insulating layer 190, and the contact plug 180 may be formed by filling a conductive material in the contact hole. A lower surface of the contact hole may be recessed into the source/drain regions 150. In an example embodiment, the contact plug 180 may be formed to penetrate the fourth epitaxial layer 154 and to partially penetrate the third epitaxial layer 153. However, the shape and arrangement of the contact plug 180 are not limited thereto, and may be varied.

In FIGS. 9A to 9K, the process of manufacturing the third epitaxial layer 153 by a first process of forming and reflowing the third lower epitaxial layer 153P1 and a second process of forming and reflowing the third preliminary epitaxial layer 153P2, but the method of forming the third epitaxial layer 153 is not limited thereto. In example embodiments, the third epitaxial layer 153 may be formed by performing three or more processes.

The example embodiments described above may be applied regardless of the length of the channel, the type of device, and the like. For example, the example embodiments may be applicable to both a semiconductor device having a short channel and a long channel. Also, the example embodiments may be applicable to both a single gate (SG) device and an extra gate (EG) device.

According to the aforementioned example embodiments, by controlling the structure of the source/drain region, a semiconductor device having improved electrical properties may be provided.

While the example embodiments have been illustrated and described above, it will be apparent to those skilled in the art that modifications and variations could be made without departing from the scope of the present disclosure as defined by the appended claims.

What is claimed is:

1. A semiconductor device, comprising:
   an active region extending in a first direction on a substrate;
   a plurality of channel layers spaced apart from each other in a vertical direction orthogonal to an upper surface of the substrate, on the active region;
   a gate structure intersecting the active region and the plurality of channel layers, surrounding the plurality of channel layers, and extending in a second direction, on the substrate; and
   a source/drain region extending on the active region and on at least one side of the gate structure, and contacting the plurality of channel layers, said source/drain region including:
      a first epitaxial layer extending on the active region and in contact with the plurality of channel layers, and having a first upper surface configured to be recessed;
      a second epitaxial layer in contact with a first portion of the first upper surface of the first epitaxial layer and having a second upper surface configured to be recessed; and
      a third epitaxial layer in contact with: (i) a second portion of the first upper surface of the first epitaxial layer, and (ii) the second upper surface of the second epitaxial layer,
      wherein the third epitaxial layer has a third upper surface, and wherein the third upper surface is at a level lower than a level of an upper surface of an uppermost channel layer among the plurality of channel layers, relative to the substrate.

2. The device of claim 1, wherein a surface of the third epitaxial layer that is in contact with the second upper surface of the second epitaxial layer is at a level higher than a level of a lower surface of a lowermost channel layer among the plurality of channel layers, relative to the substrate.

3. The device of claim 1, wherein a surface of the third epitaxial layer in contact with the second portion of the first upper surface of the first epitaxial layer is at a level lower than a level of an upper surface of an uppermost channel layer among the plurality of channel layers, relative to the substrate.

4. The device of claim 1, wherein a point at which the first to third epitaxial layers meet is between: (i) a lower surface of an uppermost channel layer among the plurality of channel layers, and (ii) an upper surface of a second uppermost channel layer adjacent to the uppermost channel layer.

5. The device of claim 1, wherein a point at which the first to third epitaxial layers meet is between: (i) an upper surface of a lowermost channel layer among the plurality of channel layers, and (ii) a lower surface of a second lowermost channel layer adjacent to the lowermost channel layer.

6. The device of claim 1, wherein the second epitaxial layer extends on a level higher than a level of an upper surface of the active region, relative to the substrate.

7. The device of claim 1, wherein a surface of the third epitaxial layer in contact with the second upper surface of the second epitaxial layer has at least one of a rounded shape and a chamfered shape.

8. The device of claim 1, wherein the third epitaxial layer has a width increasing in a direction extending away from an upper surface of the active region.

9. The device of claim 1, wherein the gate structure includes: (i) an upper portion extending on an uppermost channel layer among the plurality of channel layers and, (ii) a lower portion between the plurality of channel layers and the substrate.

10. The device of claim 9, wherein the first epitaxial layer includes a protrusion extending toward the gate structure on the same level as a level of the lower portion of the gate structure.

11. The device of claim 1, wherein the third epitaxial layer has a third upper surface extending on the second upper surface; and wherein the source/drain region further includes a fourth epitaxial layer disposed to be in contact with a third portion of the first upper surface of the first epitaxial layer and the third upper surface of the third epitaxial layer.

12. A semiconductor device, comprising:
an active region extending in a first direction on a substrate;
a stacked plurality of channel layers spaced apart from each other in a vertical direction perpendicular to an upper surface of the substrate, on the active region;
a gate structure intersecting the active region and the plurality of channel layers, surrounding the plurality of channel layers, respectively, and extending in a second direction, on the substrate; and
a source/drain region disposed on the active region on at least one side of the gate structure and in contact with the plurality of channel layers, said source/drain region comprising:
a first epitaxial layer disposed on the active region and extending to be in contact with the plurality of channel layers;
a second epitaxial layer disposed on the first epitaxial layer;
a third epitaxial layer disposed on the second epitaxial layer; and
a fourth epitaxial layer disposed on the third epitaxial layer; and
wherein the third epitaxial layer includes: (i) a first surface in contact with the fourth epitaxial layer, (ii) a second surface in contact with the first epitaxial layer, (iii) a third surface in contact with the second epitaxial layer, and wherein the first surface is at a level lower than a level of an upper surface of an uppermost channel layer among the plurality of channel layers, relative to the substrate.

13. The semiconductor device of claim 12, wherein the third surface of the third epitaxial layer extends on a level between a lower surface of a lowermost channel layer among the plurality of channel layers and a lower surface of an uppermost channel layer among the plurality of channel layers.

14. The semiconductor device of claim 12, wherein at least a portion of the first surface of the third epitaxial layer extends on a level between an upper surface and a lower surface of an uppermost channel layer among the plurality of channel layers.

15. The semiconductor device of claim 12, wherein the second surface of the third epitaxial layer extends on a level higher than a level of an upper surface of a lowermost channel layer among the plurality of channel layers.

16. The semiconductor device of claim 12, wherein an aspect ratio of the third epitaxial layer is about 1.0 to about 1.5.

17. The semiconductor device of claim 12, wherein at least a portion of an upper surface of the fourth epitaxial layer is substantially coplanar with an upper surface of an uppermost channel layer among the plurality of channel layers.

18. A semiconductor device, comprising:
an active region extending in a first direction on a substrate;
a gate structure intersecting the active region and extending in a second direction, on the substrate; and
a source/drain region disposed on the active region on at least one side of the gate structure, said source/drain region comprising:
a lower epitaxial layer having an upper surface configured to be recessed;
an upper epitaxial layer disposed on the lower epitaxial layer and having a lower surface having a curved shape, curved toward the upper surface of the lower epitaxial layer; and
an intermediate epitaxial layer disposed between the lower epitaxial layer and the upper epitaxial layer; and
wherein an uppermost end of the intermediate epitaxial layer extends on a level lower than a level of an uppermost end of the upper epitaxial layer and an uppermost end of the lower epitaxial layer,
wherein the upper epitaxial layer has an upper surface, and wherein the upper surface of the upper epitaxial layer is at a level lower than a level of an upper surface of the active region, relative to the substrate.

19. The semiconductor device of claim 18,
wherein the lower epitaxial layer includes first silicon germanium (SiGe) including germanium (Ge) of a first concentration;
wherein the intermediate epitaxial layer includes second silicon germanium (SiGe) including germanium (Ge) of a second concentration higher than the first concentration;
wherein the upper epitaxial layer includes third silicon germanium (SiGe) including germanium (Ge) having a third concentration higher than the second concentration; and wherein the first concentration of the lower epitaxial layer is about 5 at % to about 8 at %; wherein the second concentration of the intermediate epitaxial layer is about 40 at % to about 45 at %; and wherein the third concentration of the upper epitaxial layer is about 50 at % to about 55 at %.

20. The device of claim 1, wherein a point at which the first to third epitaxial layers meet is between: (i) a lower surface of an uppermost channel layer among the plurality of channel layers, and (ii) an upper surface of a lowermost channel layer.

* * * * *